US012648144B2

(12) United States Patent (10) Patent No.: US 12,648,144 B2
Takeda et al. (45) Date of Patent: Jun. 2, 2026

(54) SEMICONDUCTOR DEVICE

(71) Applicant: Kioxia Corporation, Tokyo (JP)

(72) Inventors: Hiroshi Takeda, Yokkaichi Mie (JP);
Keitaro Naito, Yokkaichi Mie (JP)

(73) Assignee: Kioxia Corporation, Tokyo (JP)

( * ) Notice: Subject to any disclaimer, the term of this
patent is extended or adjusted under 35
U.S.C. 154(b) by 555 days.

(21) Appl. No.: 18/158,411

(22) Filed: Jan. 23, 2023

(65) Prior Publication Data

US 2024/0074199 A1 Feb. 29, 2024

(30) Foreign Application Priority Data

Aug. 31, 2022 (JP) ................................. 2022-138152

(51) Int. Cl.
*H10B 43/30* (2023.01)
*H10B 43/27* (2023.01)
(52) U.S. Cl.
CPC ............. *H10B 43/30* (2023.02); *H10B 43/27*
(2023.02)
(58) Field of Classification Search
CPC ......... H10B 43/27; H10B 43/30; H10B 43/35
See application file for complete search history.

(56) References Cited

U.S. PATENT DOCUMENTS

| 9,236,395 | B1 | 1/2016 | Sasaki |
|---|---|---|---|
| 2012/0003800 | A1 | 1/2012 | Lee |
| 2020/0251490 | A1 | 8/2020 | Matsumoto |
| 2022/0302161 | A1 | 9/2022 | Takeda |

FOREIGN PATENT DOCUMENTS

| JP | 2012015517 A | 1/2012 |
|---|---|---|
| JP | 2020126943 A | 8/2020 |
| JP | 2022146629 A | 10/2022 |

*Primary Examiner* — Brent A. Fairbanks
*Assistant Examiner* — Molly K Reida
(74) *Attorney, Agent, or Firm* — Kim & Stewart LLP

(57) ABSTRACT

A semiconductor device includes a first plurality of conductive layers stacked one on the other via an insulating layer and a second plurality of conductive layers above the first plurality. A semiconductor film passes through the conductive layers in a stacking direction. A charge storage film is between the semiconductor film and the stacked conductive layers. A dummy memory cell is at a position where an uppermost conductive layer among the first plurality of conductive layers meets the semiconductor film. A memory cell is at a position where a second conductive layer among the first plurality meets the semiconductor film. A missing amount of an upper corner of the first conductive layer is larger than a missing amount of an upper corner of the second conductive layer.

20 Claims, 23 Drawing Sheets

CT          BLK1          6ac

7

Δx

106a1

BLK2

Δz 6a
6a1
BLK1

BLK2

6
(DWL1)          W$_{WL}$

6d

6c t$_{BLK1}$          t$_{BLK2}$

BLK2

7

CT          BLK1          6b

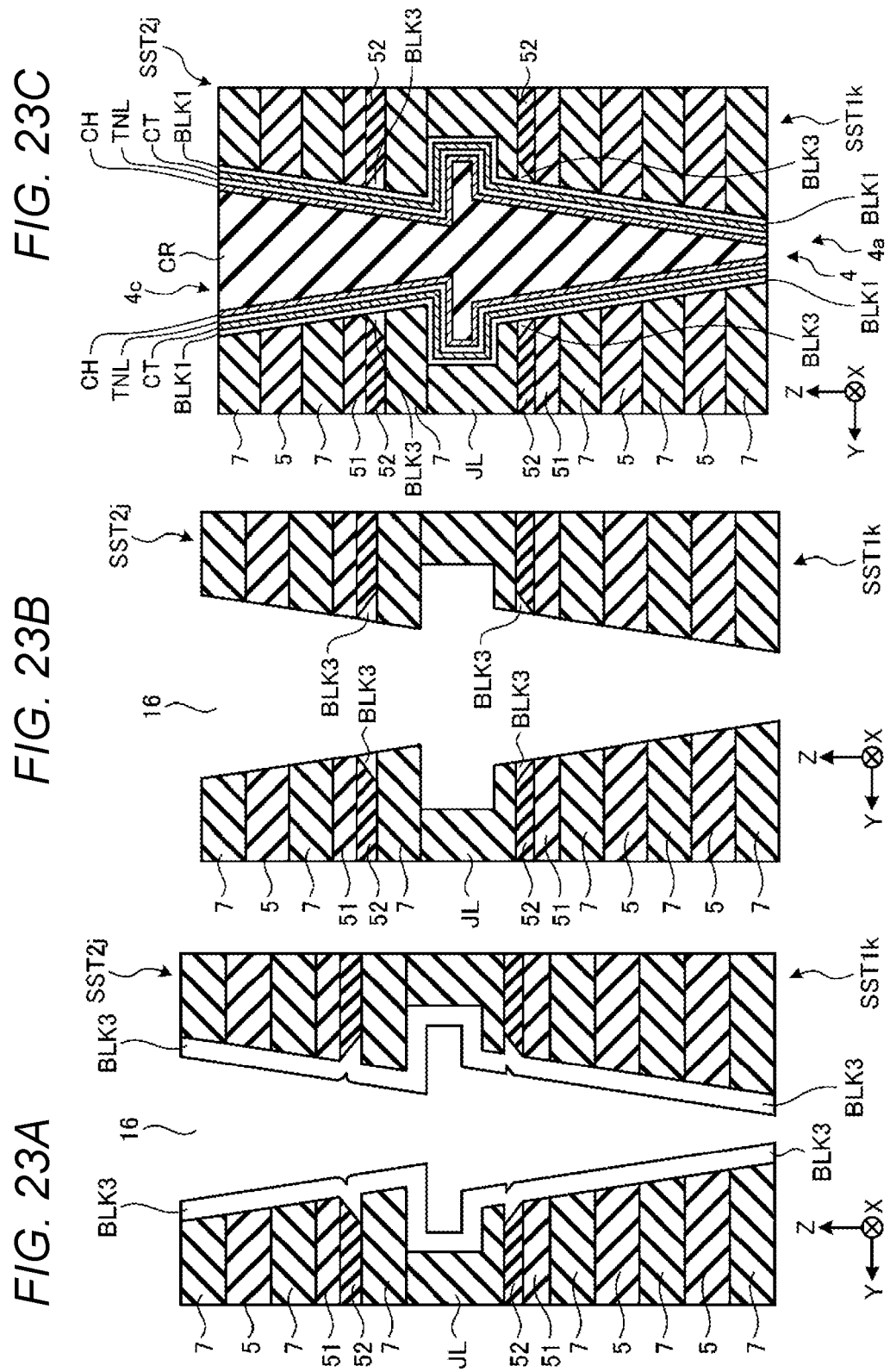

SEMICONDUCTOR DEVICE

CROSS-REFERENCE TO RELATED APPLICATION

This application is based upon and claims the benefit of priority from Japanese Patent Application No. 2022-138152, filed Aug. 31, 2022, the entire contents of which are incorporated herein by reference.

FIELD

Embodiments described herein relate generally to a semiconductor device.

BACKGROUND

A semiconductor device having a three-dimensional structure in which a columnar semiconductor film penetrates a stacked body of a plurality of conductive layers and insulating layers is known. In such a device, parts where each conductive layer comes into proximity to the columnar semiconductor film function as memory cells. However, in such a device it would be desirable to improve operational reliability.

BRIEF DESCRIPTION OF THE DRAWINGS

FIGS. 23A to 23C are cross-sectional views illustrating aspects of a method for manufacturing a semiconductor device according to a third embodiment.

DETAILED DESCRIPTION

In general, according to one embodiment, a semiconductor device includes a first stacked body in which a first plurality of conductive layers are stacked one on the other via an insulating layer and a second stacked body above the first stacked body in a stacking direction. The second stacked body has a second plurality of conductive layers stacked one on the other via an insulating layer. A semiconductor film passes through the first stacked body and the second stacked body in the stacking direction. A charge storage film is between the semiconductor film and the first and second stacked bodies. A first dummy memory cell is at a position where a first conductive layer closest to the second stacked body among the first plurality of conductive layers meets the semiconductor film. A first memory cell is at a position where a second conductive layer farther from the second stacked body than the first conductive layer among the first plurality of conductive layers meets the semiconductor film. A missing amount of an upper corner at an end portion of the first conductive layer facing the charge storage film is larger than a missing amount of an upper corner at an end portion of the second conductive layer facing the charge storage film.

Hereinafter, semiconductor devices according to certain non-limiting example embodiments will be described with reference to the accompanying drawings.

First Embodiment

A semiconductor device according to a first embodiment has a three-dimensional structure in which a columnar semiconductor film penetrates a stacked body in which a plurality of conductive layers are stacked via an insulating layer and the part where each conductive layer and the semiconductor film are in proximity functions as a memory cell. Operational reliability improvement is pursued in this semiconductor device.

Figure 1:
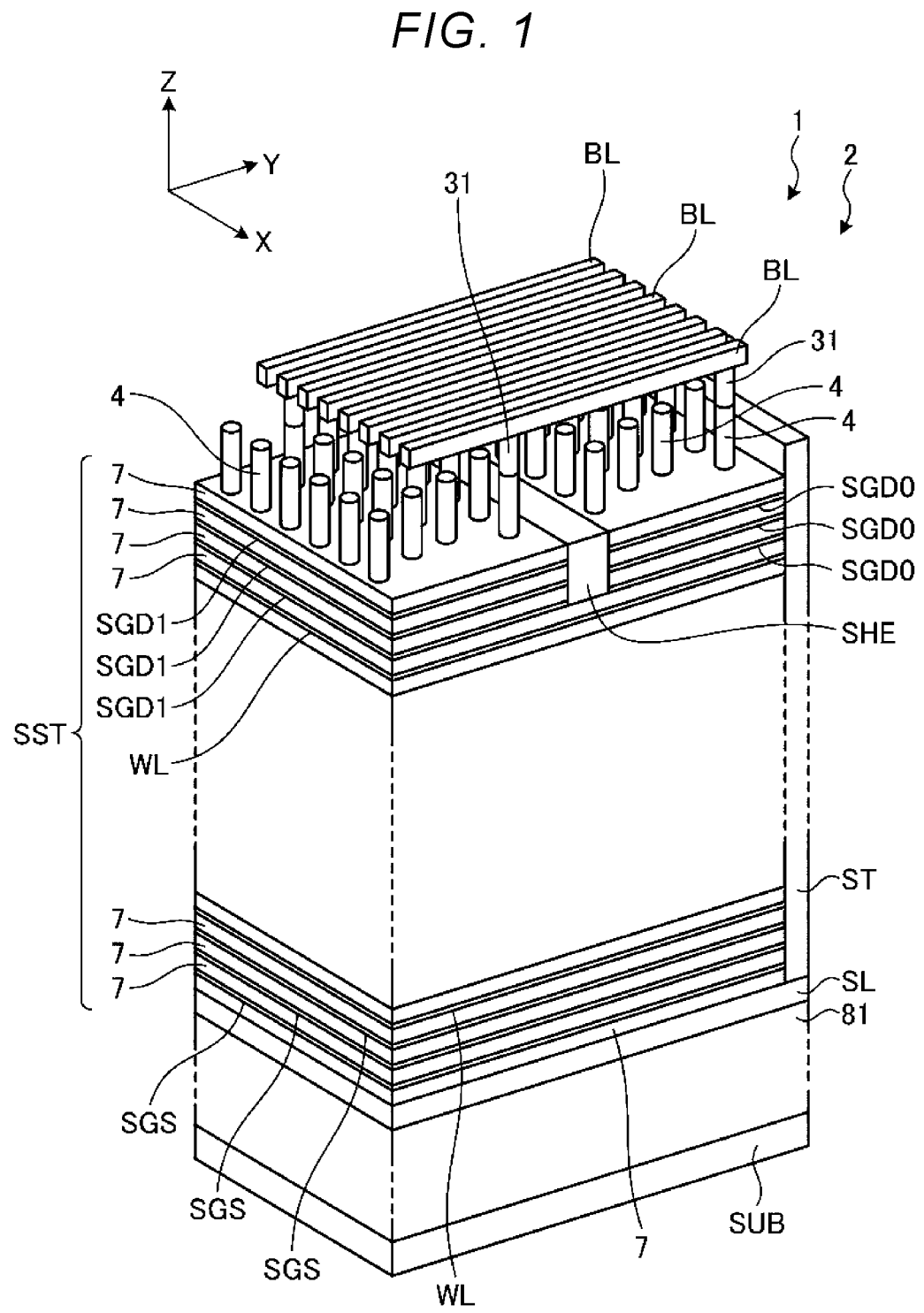
FIG. 1 is a perspective view illustrating a semiconductor device according to a first embodiment.

A semiconductor device 1 is configured as illustrated in FIG. 1. FIG. 1 is a perspective view illustrating a schematic configuration of the semiconductor device 1.

In the following description, the terms X and Y directions are used for convenience. The X and Y directions are mutually orthogonal and in a plane parallel to a surface of a substrate SUB. More specifically, the X direction is a direction in which word lines WL extend, and the Y direction is a direction in which bit lines BL extend. The Z direction is orthogonal to the surface of the substrate SUB. Therefore, the Z direction is orthogonal to the X and Y directions.

As illustrated in FIG. 1, the semiconductor device 1 includes select gates SGS, word lines WL, and select gates SGD. The select gates SGS are stacked on the substrate SUB via insulating layers 7. In the example of FIG. 1, the select gates SGS are provided in three layers. The word lines WL are stacked, via the insulating layers 7, on the top-layer select gate SGS. In the example of FIG. 1, the word lines WL are provided in a plurality of layers alternating with the insulating layers 7 along the Z direction. The select gates SGD are stacked via the insulating layers 7 on the top-layer (uppermost) word line WL. Each of the select gates SGS, the word lines WL, and the select gates SGD has a plate (planar) shape extending in the X and Y directions (XY direction).

In the example of FIG. 1, the select gate SGD, the word line WL, and the select gate SGS are divided and insulated in the Y direction by a slit ST. A source line SL is disposed on the +Z side of the substrate SUB via an interlayer insulating film 81. The slit ST is provided on the +Z side of the source line SL and extends in the X and Z directions.

The select gate SGD is divided in the Y direction by, for example, a division film SHE. In the example of FIG. 1, select gates SGD0 and SGD1 divided in the Y direction are illustrated. The division film SHE is provided above the word lines WL (on the +Z side) and extends in the X direction and the Z direction. Therefore, the select gate SGD0 and the select gate SGD1 are disposed side by side in the Y direction on the word lines WL. In the example of FIG. 1, the select gates SGD0 and SGD1 are provided in three layers each.

The substrate SUB is, for example, a silicon substrate. The select gate SGS, the word line WL, and the select gate SGD are metal layers comprising, for example, tungsten (W). The insulating layer 7 and the interlayer insulating film 81 are insulators comprising, for example, silicon oxide.

The semiconductor device 1 further includes a plurality of columnar bodies 4. Each columnar body 4 penetrates the select gates SGS, the word lines WL, and the select gates SGD and extends in the Z direction (stacking direction). The semiconductor device 1 further includes the plurality of bit lines BL provided above the select gates SGD.

Each of the columnar bodies 4 is electrically connected to a bit line BL via a contact plug 31. For example, one of the columnar bodies 4 sharing the select gate SGD0 and one of the columnar bodies 4 sharing the select gate SGD1 are electrically connected to the same bit line BL.

In FIG. 1, an interlayer insulating film that is provided between the select gate SGD and the bit line BL has been omitted for simplification of illustration.

In the semiconductor device 1, each of the select gates SGD, the word lines WL, and the select gates SGS is formed on a different conductive layer (level). A stacked body SST in which the conductive layers and the insulating layers 7 are alternately stacked is configured on the +Z side of the source line SL. A three-dimensional memory cell arrangement (memory cell array) is included in the columnar bodies 4 penetrating the stacked body SST.

In other words, in the semiconductor device 1, the part where a word line WL and a columnar body 4 intersect functions as a memory cell, and memory cell array 2 has a plurality of such memory cells three-dimensionally arranged therein. In addition, the part where a select gate SGS and a columnar body 4 intersect functions as a source-side select transistor, and the part where select gates SGD0 or SGD1 and a columnar body 4 intersect functions as a drain-side select transistor. In the semiconductor device 1, by increasing the number of the stacked layers of the word lines WL in the stacked body SST, an increase in storage capacity can be achieved even without using a finer patterning technique.

Figure 2:
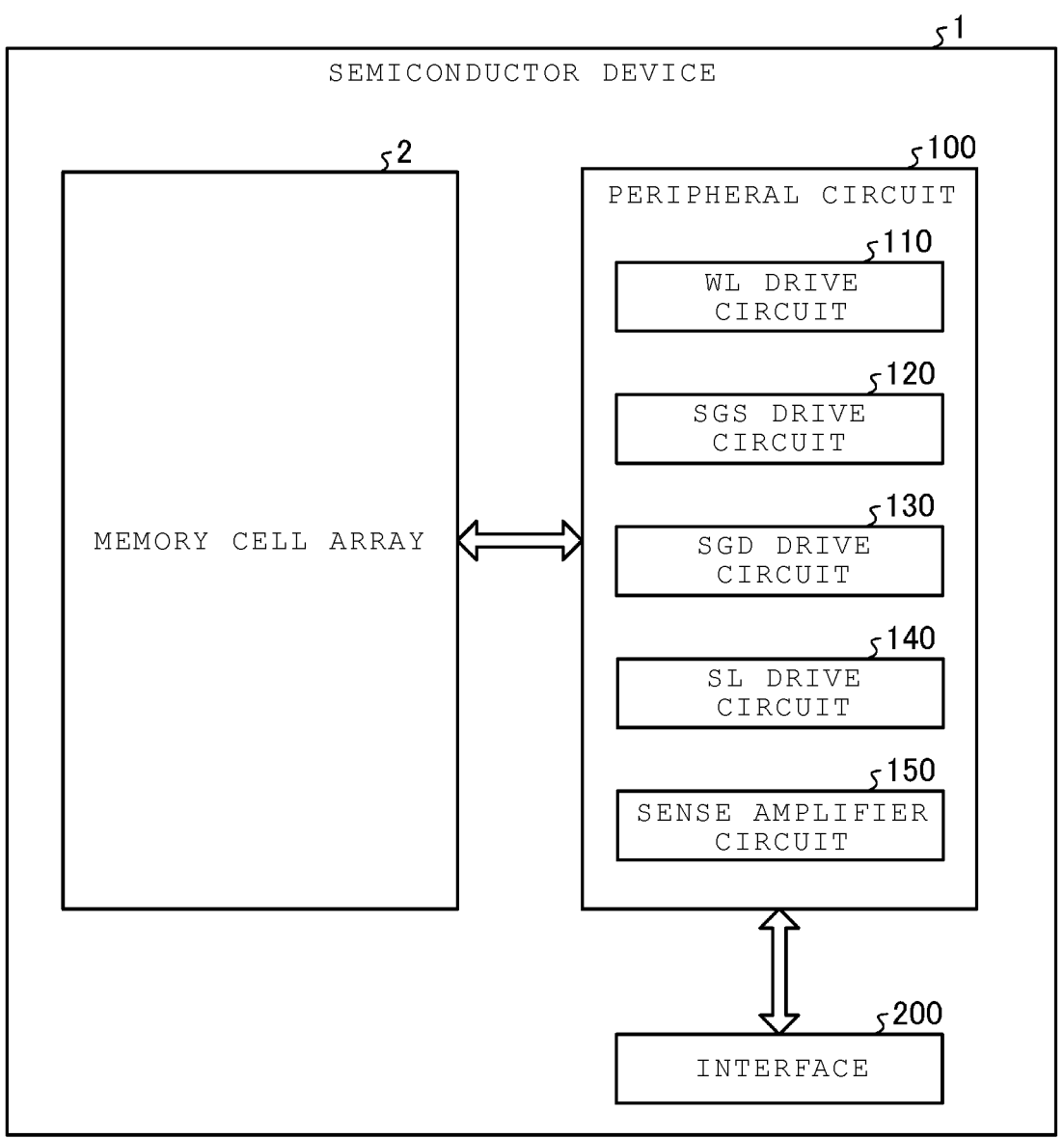
FIG. 2 is a block diagram illustrating a semiconductor device according to a first embodiment.

FIG. 2 is a block diagram illustrating the schematic configuration of the semiconductor device 1.

As illustrated in FIG. 2, the semiconductor device 1 has the memory cell array 2, a peripheral circuit 100, and an interface 200. The peripheral circuit 100 includes a WL drive circuit 110, an SGS drive circuit 120, an SGD drive circuit 130, an SL drive circuit 140, and a sense amplifier circuit 150.

The WL drive circuit 110 is a circuit that controls the voltage applied to the word line WL, and the SGS drive circuit 120 is a circuit that controls the voltage applied to the select gate SGS. The SGD drive circuit 130 is a circuit that controls the voltage applied to the select gate SGD, and the SL drive circuit 140 is a circuit that controls the voltage applied to the source line SL. The sense amplifier circuit 150 is a circuit that controls the voltage applied to the bit line BL and a circuit that determines read data according to a signal from a selected memory cell.

The peripheral circuit 100 controls the operation of the semiconductor device 1 based on instructions input from the outside (for example, a memory controller of a memory system to which the semiconductor device 1 is applied) via the interface 200.

Figure 3:
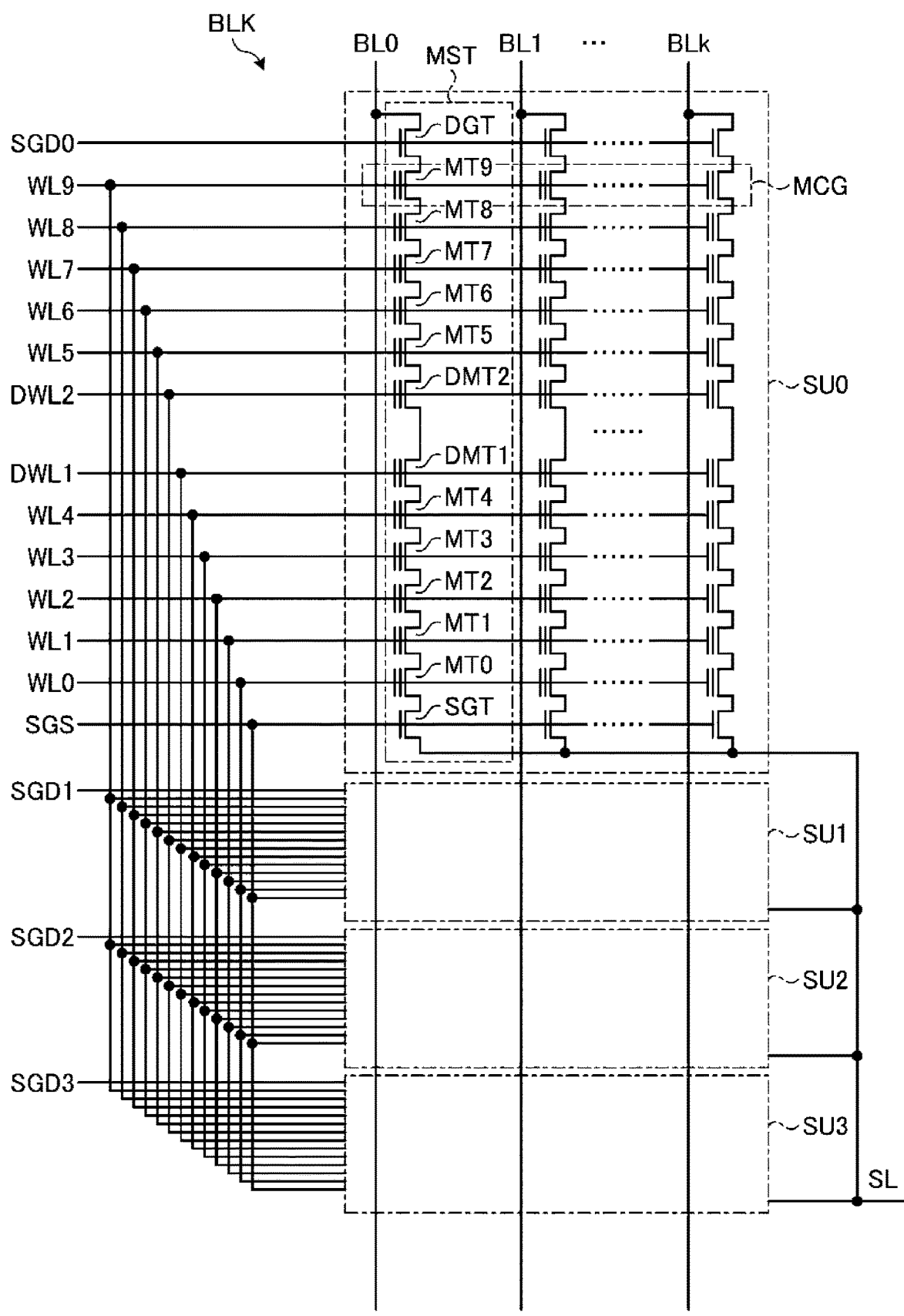
FIG. 3 is a circuit diagram of a memory cell array in a first embodiment.

Next, the circuit configuration of the memory cell array 2 will be described with reference to FIG. 3. FIG. 3 is a circuit diagram illustrating a configuration of the memory cell array 2.

The memory cell array 2 has a plurality of blocks BLK, each of which is a set of a plurality of memory cell transistors MT. Hereinafter, the memory cell transistor MT will be simply referred to as a memory cell MT.

Each block BLK has a plurality of string units SU0, SU1, SU2, and SU3, which are sets of the memory cells MT associated with the word lines WL and the bit lines BL. Each of the string units SU0 to SU3 has a plurality of memory strings MST in which the memory cells MT are connected in series. The number of the memory strings MST in the string units SU0 to SU3 may be freely selected.

The plurality of string units SU0, SU1, SU2, and SU3 correspond to the plurality of select gates SGD0, SGD1, SGD2, and SGD3, share the select gate SGS, and function as a plurality of drive units in the block BLK. Each string unit SU can be driven with the select gate SGD and the select gate SGS corresponding thereto. In addition, each string unit SU includes the plurality of memory strings MST.

Each memory string MST includes, for example, 10 memory cells MT (MT0 to MT9) and select transistors DGT and SGT. The memory cell MT has a control gate and a charge storage film and latches and stores data in a non-volatile manner. Further, the 10 memory cells MT are connected in series between the source of the select transistor DGT and the drain of the select transistor SGT. The number of memory cells MT in the memory string MST is not limited to ten.

The gates of the select transistors DGT in the string units SU0 to SU3 are connected to the select gates SGD0 to SGD3, respectively. In contrast, the gates of the select transistors SGT in the respective string units SU are connected in common to, for example, the select gate SGS.

The drain of the select transistor DGT of each memory string MST in each string unit SU is connected to each of the different bit lines BL0 to BLk (where k is any integer of 2 or more). In addition, the bit lines BL0 to BLk connect in common one memory string MST in each string unit SU between the plurality of blocks BLK. Further, the source of each select transistor SGT is connected in common to the source line SL.

In other words, the string unit SU is a set of the memory strings MST connected to the different bit lines BL0 to BLk and connected to the same select gate SGD. In addition, each block BLK is a set of the plurality of string units SU0 to SU3 sharing the word line WL. Further, the memory cell array 2 is a set of the plurality of blocks BLK sharing the bit lines BL0 to BLk.

The group of memory cells MT sharing the same word line WL in each string unit SU is called a "memory cell group MCG", and the memory cell group MCG is the minimum unit size of the set of the memory cells MT to which a predetermined voltage (for example, write and read voltages) can be collectively applied via the same word line WL.

A dummy word line DWL1 and a dummy word line DWL2 are provided between the word line WL4 and the word line WL5. A dummy memory cell DMT1 and a dummy memory cell DMT2 to correspond to the dummy word line DWL1 and the dummy word line DWL2 are provided between the memory cell MT4 and the memory cell MT5 in each memory string MST. Each dummy memory cell DMT1 and dummy memory cell DMT2 has the same structure as the memory cell MT but is not used for data storage.

Figure 4:
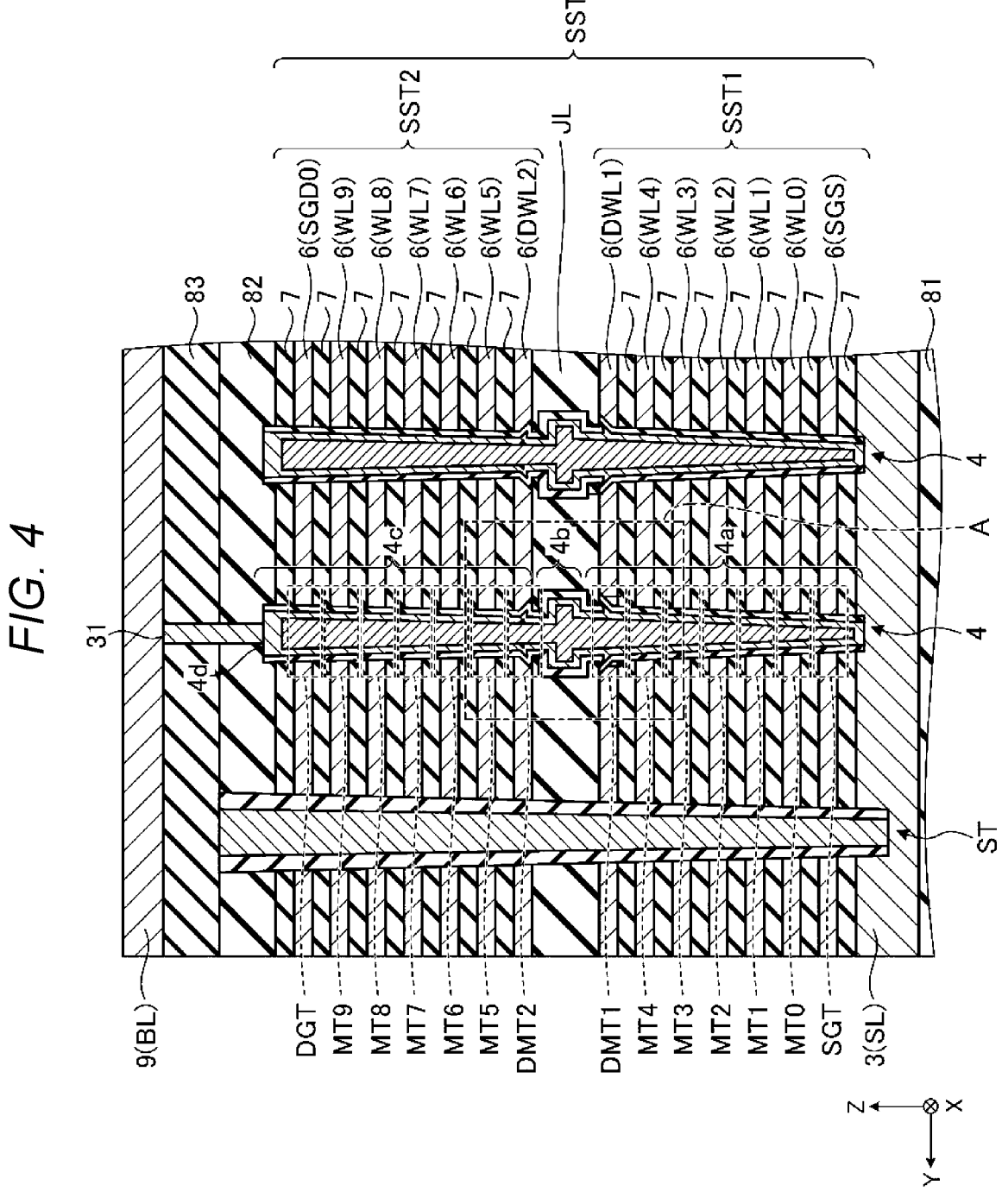
FIG. 4 is a cross-sectional view of a memory cell array in a first embodiment.

Next, a cross-sectional configuration of the memory cell array 2 will be described with reference to FIG. 4. FIG. 4 is a cross-sectional view illustrating the configuration of the memory cell array 2.

In the semiconductor device 1, a conductive layer 3 is disposed via the interlayer insulating film 81 on the +Z side of the substrate SUB. The conductive layer 3 can be formed of a material having an impurity-containing semiconductor (for example, silicon) as a main component or a material having a conductive material (for example, a metal such as tungsten) as a main component. The conductive layer 3 extends in a plate shape in an XY direction and functions as the source line SL (see FIG. 1). The plurality of columnar bodies 4 are disposed on the +Z side of the conductive layer 3. The plurality of columnar bodies 4 are located in the XY direction. Each columnar body 4 extends in the Z direction and penetrates the stacked body SST (see FIG. 1).

The stacked body SST has a structure in which a plurality of stacked bodies SST1 and SST2 are stacked. Although FIG. 4 illustrates a structure in which the stacked body SST is divided into the two stacked bodies SST1 and SST2, the stacked body SST may be divided into three or more.

In each columnar body 4 illustrated in FIG. 4, a tier 4a, a joint portion 4b, a tier 4c, and a cap layer 4d are stacked in order on the +Z side of the conductive layer 3. In the stacked body SST, the stacked body SST1, a joint layer JL, and the stacked body SST2 are stacked in order on the +Z side of the conductive layer 3. Each of the stacked bodies SST1 and SST2 is configured by stacking conductive layers 6 functioning as, for example, the word lines WL via the insulating layers 7. The tier 4a extends in the Z direction and penetrates the stacked body SST1. The joint portion 4b has a Z position corresponding to the joint layer JL. The joint layer JL can be formed of a material having an oxide (for example, silicon oxide) as a main component. The tier 4c extends in the Z direction and penetrates the stacked body SST2. The +Z side end portion of the tier 4a is coupled to the tier 4c via the joint portion 4b. The cap layer 4d extends in a plate shape in the XY direction and covers the +Z side end of the tier 4c. The cap layer 4d can be formed of, for example, a material having an impurity-containing semiconductor (for example, polysilicon) as a main component. A conductive layer 9 is disposed on the +Z side of the stacked body SST2 via interlayer insulating films 82 and 83. The conductive layer 9 can be formed of a material having a conductive material (for example, a metal such as tungsten) as a main component. The conductive layer 9 extends in a line shape in the Y direction and functions as the bit line BL (see FIG. 1). The cap layer 4d is connected to the bit line BL via the contact plug 31.

Figure 5:
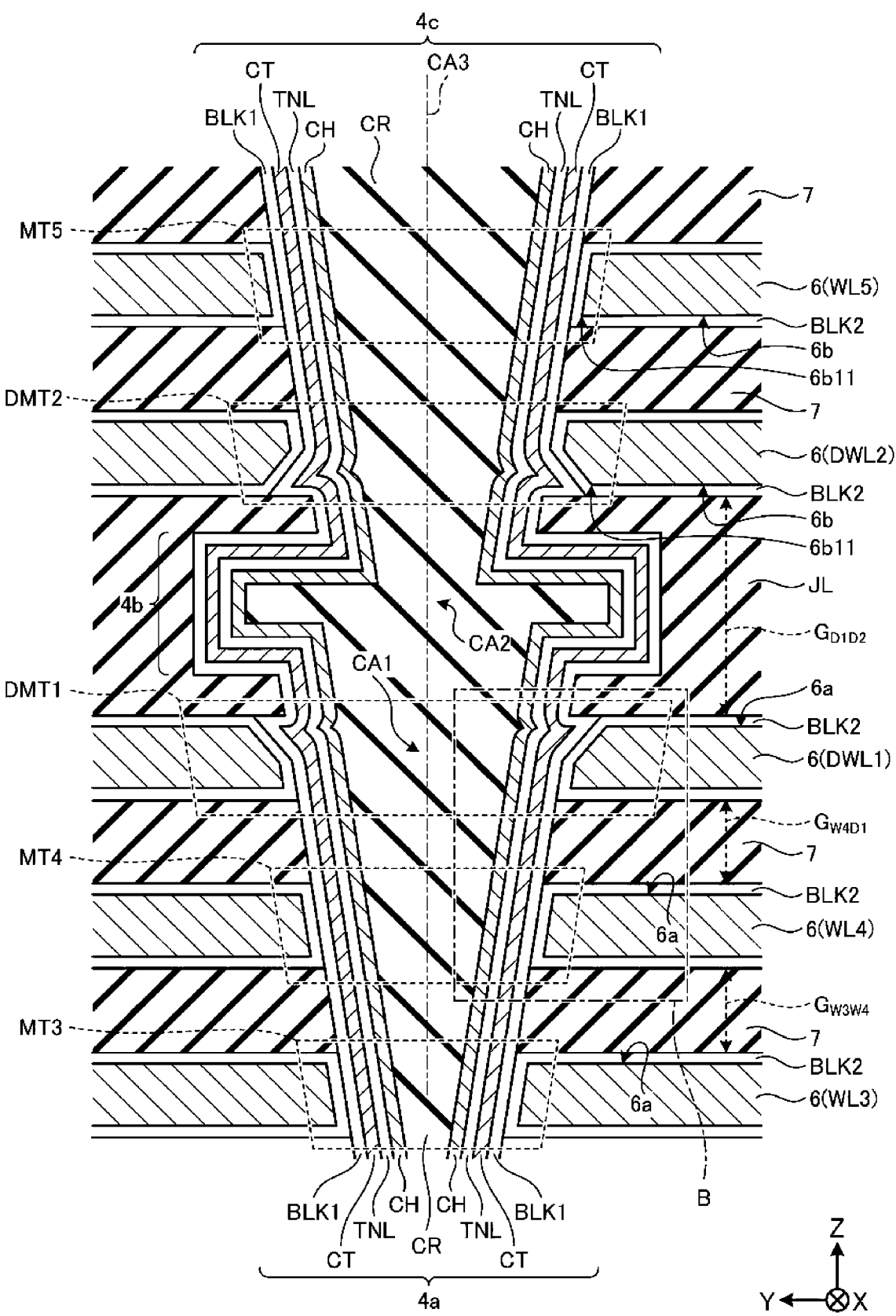
FIG. 5 is an enlarged cross-sectional view of a memory cell array in a first embodiment.

As illustrated in FIG. 5, each of the tiers 4a and 4c has a columnar shape with central axes CA1 and CA3 along the Z direction and has, for example, a substantially cylindrical shape. FIG. 5 is an enlarged cross-sectional view illustrating the configuration of the vicinity of the joint portion 4b and is an enlarged cross-sectional view in which the A part of FIG. 4 is illustrated in an enlarged manner. Each of the tiers 4a and 4c may have a tapered shape in which a diameter at a −Z side end is narrower than a diameter at a +Z side end. Each of the tiers 4a and 4c may have a bowing shape in which the diameter at the −Z side end is narrower than the diameter at the +Z side end and a diameter is widened at a predetermined Z position between the +Z side end and the −Z side end. The diameter at the −Z side end of the tier 4c is smaller than the diameter at the +Z side end of the tier 4a.

The joint portion 4b has a disk shape extending in the XY direction with a central axis CA2 along the Z direction. The −Z side surface of the joint portion 4b is in contact with the +Z side end of the tier 4a, and the +Z side surface of the joint portion 4b is in contact with the −Z side end of the tier 4c. The joint portion 4b couples the +Z side end of the tier 4a to the −Z side end of the tier 4c and couples the tier 4a and the tier 4c in the Z direction. The joint portion 4b is larger in diameter than the +Z side end of the tier 4a and larger in diameter than the −Z side end of the tier 4c. An XY position of the central axis CA2 of the joint portion 4b may deviate from an XY position of the central axis CA1 of the tier 4a and/or an XY position of the central axis CA3 of the tier 4c. In other words, the XY position of the central axis CA1 of the tier 4a and the XY position of the central axis CA3 of the tier 4c may deviate from each other. As a result, a margin for XY alignment of the tier 4a and the tier 4c can be ensured. The joint portion 4b has a Z-direction width larger than a Z-direction thickness of the conductive layer 6 and a Z-direction thickness of the insulating layer 7. As a result, the coupling margin of the tier 4a and the tier 4c can be ensured. Accordingly, the joint layer JL has a Z-direction thickness larger than the Z-direction thickness of the conductive layer 6 and the Z-direction thickness of the insulating layer 7.

As illustrated in FIG. 5, the tier 4a has a core member CR, a semiconductor film CH, an insulating film TNL, a charge storage film CT, and an insulating film BLK1 in order from the central axis CA1 side. The core member CR is disposed near the central axis CA1 of the tier 4a and has a substantially cylindrical shape extending along the central axis CA1 of the tier 4a. The core member CR can be formed of a material having an insulating material (for example, a semiconductor oxide such as silicon oxide) as a main component.

The semiconductor film CH surrounds the core member CR from the outside and has a substantially cylindrical shape extending along the central axis CA1 of the tier 4a. Further, the semiconductor film CH covers the −Z side end portion of the core member CR and is connected to the conductive layer 3. The semiconductor film CH can be formed of a material having a substantially impurity-free semiconductor (for example, polysilicon) as a main component. The insulating film TNL surrounds the semiconductor film CH from the outside and has a substantially cylindrical shape extending along the central axis CA1 of the tier 4a. The insulating film TNL can be formed of a material having an oxide (for example, silicon oxide or silicon oxynitride) as a main component. The charge storage film CT surrounds the insulating film TNL from the outside and includes a substantially cylindrical shape extending along the central axis CA1 of the tier 4a. The charge storage film CT can be formed of a material having a nitride (for example, silicon nitride) as a main component. The insulating film BLK1 surrounds the charge storage film CT from the outside and has a substantially cylindrical shape extending along the central axis CA1 of the tier 4a. The insulating film BLK1 can be formed of a material having an oxide (for example, silicon oxide, metal oxide, or stack thereof) as a main component. As a result, an ONO-type three-layer structure in which the charge storage film CT is interposed between a pair of insulating films TNL and BLK1 can be configured.

The joint portion 4b has the core member CR, the semiconductor film CH, the insulating film TNL, the charge storage film CT, and the insulating film BLK1 in order from the central axis CA2 side. In the joint portion 4b, the core member CR has a substantially disk shape larger in diameter than the core member CR of the tier 4a. The semiconductor film CH has a hollow disk shape larger in diameter than the semiconductor film CH of the tier 4a. The insulating film TNL has a hollow disk shape larger in diameter than the insulating film TNL of the tier 4a. The charge storage film CT has a hollow disk shape larger in diameter than the charge storage film CT of the tier 4a. The insulating film BLK1 has a hollow disk shape larger in diameter than the insulating film BLK1 of the tier 4a.

The tier 4c has the core member CR, the semiconductor film CH, the insulating film TNL, the charge storage film CT, and the insulating film BLK1 in order from the central axis CA3 side. The core member CR is disposed near the central axis CA3 of the tier 4c and has a substantially cylindrical shape extending along the central axis CA3 of the tier 4c. The semiconductor film CH surrounds the core member CR from the outside and has a substantially cylindrical shape extending along the central axis CA3 of the tier 4c. The insulating film TNL surrounds the semiconductor film CH from the outside and has a substantially cylindrical shape extending along the central axis CA3 of the tier 4c. The charge storage film CT surrounds the insulating film TNL from the outside and has a substantially cylindrical shape extending along the central axis CA3 of the tier 4c. The insulating film BLK1 surrounds the charge storage film CT from the outside and has a substantially cylindrical shape extending along the central axis CA3 of the tier 4c. The core member CR, the semiconductor film CH, the insulating film TNL, the charge storage film CT, and the insulating film BLK1 of the tier 4c are formed of the same materials as the core members CR, the semiconductor films CH, the insulating films TNL, the charge storage films CT, and the insulating films BLK1 of the tier 4a and the joint portion 4b, respectively. As a result, the ONO-type three-layer structure in which the charge storage film CT is interposed between the pair of insulating films TNL and BLK1 can be configured.

The semiconductor film CH of the tier 4a is connected to the conductive layer 3 as the source line SL on the −Z side and is connected to the semiconductor film CH of the joint portion 4b on the +Z side. The semiconductor film CH of the joint portion 4b is connected to the semiconductor film CH of the tier 4c on the +Z side. The +Z side end portion of the semiconductor film CH of the tier 4c is connected to the conductive layer 9 functioning as the bit line BL via the cap layer 4d and the contact plug 31. In other words, the semiconductor films CH of the tier 4a, the joint portion 4b, and the tier 4c include a channel region (active region) in the memory string MST.

In each of the stacked bodies SST1 and SST2 illustrated in FIG. 4, the conductive layers 6 and the insulating layers 7 are stacked alternately and repeatedly. Each conductive layer 6 extends in a plate shape in the XY direction. Each conductive layer 6 can be formed of a material having a conductive material (for example, a metal such as tungsten) as a main component. In each conductive layer 6, a +Z side surface, a −Z side surface, and a surface facing the tiers 4a and 4c may be covered with an insulating film BLK2. The insulating film BLK2 may differ in composition from the insulating film BLK1. The insulating film BLK2 can be formed of a material having an insulating material (for example, a metal oxide such as aluminum oxide, zirconium oxide, and hafnium oxide) as a main component. Each insulating layer 7 extends in a plate shape in the XY direction. Each insulating layer 7 can be formed of a material having an insulating material (for example, a semiconductor oxide such as silicon oxide) as a main component.

In the stacked body SST1, among the plurality of conductive layers 6 mutually separated in the Z direction, at least the most −Z side conductive layer 6 functions as the select gate SGS, at least the most +Z side conductive layer 6 functions as the dummy word line DWL1, and the other conductive layers 6 function as word lines WL0 to WL4. As illustrated in FIG. 1, the plurality of conductive layers 6 on the −Z side may function as the select gates SGS and, similarly thereto, the plurality of conductive layers 6 functioning as the dummy word lines DWL1 may be provided on the +Z side.

The select transistor SGT is formed at the position where the conductive layer 6 for the select gate SGS intersects the semiconductor film CH and the charge storage film CT. The memory cell MT0 is formed at the position where the conductive layer 6 for the word line WL0 intersects the semiconductor film CH and the charge storage film CT. The memory cell MT1 is formed at the position where the conductive layer 6 for the word line WL1 intersects the semiconductor film CH and the charge storage film CT. The memory cell MT2 is formed at the position where the conductive layer 6 for the word line WL2 intersects the semiconductor film CH and the charge storage film CT. The memory cell MT3 is formed at the position where the conductive layer 6 for the word line WL3 intersects the semiconductor film CH and the charge storage film CT. The memory cell MT4 is formed at the position where the conductive layer 6 for the word line WL4 intersects the semiconductor film CH and the charge storage film CT. The dummy memory cell DMT1 is formed at the position where the conductive layer 6 for the dummy word line DWL1 intersects the semiconductor film CH and the charge storage film CT. In the tier 4a, the charge storage film CT and the insulating film BLK1 may be partially omitted at the position intersecting the conductive layer 6 for the select gate SGS in some examples.

In the stacked body SST2 stacked on the stacked body SST1 via the joint layer JL, among the plurality of conductive layers 6 mutually separated in the Z direction, at least the most +Z side (uppermost) conductive layer 6 functions as the select gate SGD, at least the most −Z side (lowermost) conductive layer 6 functions as the dummy word line DWL2, and other intermediate level conductive layers 6 function as word lines WL5 to WL9. As illustrated in FIG. 1, a plurality of conductive layers 6 on the +Z side may function as the select gates SGD and, similarly thereto, a plurality of conductive layers 6 functioning as the dummy word lines DWL2 may be provided on the −Z side.

The dummy memory cell DMT2 is formed at the position where the conductive layer 6 for the dummy word line DWL2 intersects the semiconductor film CH and the charge storage film CT. The memory cell MT5 is formed at the position where the conductive layer 6 for the word line WL5 intersects the semiconductor film CH and the charge storage film CT. The memory cell MT6 is formed at the position where the conductive layer 6 for the word line WL6 intersects the semiconductor film CH and the charge storage film CT. The memory cell MT7 is formed at the position where the conductive layer 6 for the word line WL7 intersects the semiconductor film CH and the charge storage film CT. The memory cell MT8 is formed at the position where the conductive layer 6 for the word line WL8 intersects the semiconductor film CH and the charge storage film CT. The memory cell MT9 is formed at the position where the conductive layer 6 for the word line WL9 intersects the semiconductor film CH and the charge storage film CT. The select transistor DGT is formed at the position where the conductive layer 6 for the select gate SGD intersects the semiconductor film CH and the charge storage film CT. In the tier 4c, the charge storage film CT and the insulating film BLK1 may be partially omitted at the position intersecting the conductive layer 6 for the select gate SGD in some examples.

In the processing of writing information to a memory cell MT, a write voltage is applied to the conductive layer 6 of a selected word line WL, a transfer voltage is applied to the conductive layer 6 of an unselected word line WL, and a reference voltage is applied to the semiconductor film CH. The write voltage has a potential level (for example, 20 V) for injecting charges (electrons) from the semiconductor film CH into the charge storage film CT. The transfer voltage has a potential level (for example, 10 V) between the write voltage and the reference voltage. The reference voltage has a reference potential level (for example, 0 V). As a result, charges are stored in the charge storage film CT of the selected memory cell MT at the position where the conductive layer 6 for the selected word line WL and the semiconductor film CH intersect, and information (data) is thus written into the selected memory cell MT.

In the processing of erasing information from a memory cell MT, a reference voltage is applied to the conductive layers 6 for each word line WL, an erasing voltage is applied to the semiconductor film CH, and an intermediate voltage is applied to the select gates SGS and SGD. The erasing voltage has a potential level (for example, 20 V) for injecting opposite charges (holes) from the semiconductor film CH into the charge storage film CT. The reference voltage has a reference potential level (for example, 0 V). The intermediate voltage has a potential level (for example, 5 V) between the erasing voltage and the reference voltage.

Under such control, electron-hole pairs are generated by gate induced drain leakage (GIDL) near the drains of the select transistors SGT and DGT, and opposite charges (holes) are injected from the semiconductor film CH into the charge storage film CT. As a result, the charges previously stored in the charge storage film CT can be removed, and the information (data) in the memory cell MT can be erased.

As for the conductive layer 6 for the dummy word line DWL1 at this time, because the joint portion 4b is present, as illustrated in FIG. 5, a Z-direction interval GD1D2 to the next adjacent conductive layer 6 on the +Z side is larger than a Z-direction interval GW4D1 to the next adjacent conductive layer 6 on the −Z side. As a result, the electric field in the direction from the conductive layer 6 for the dummy word line DWL1 toward the charge storage film CT is less affected by the voltage of the conductive layer 6 on the +Z side than by the voltage of the conductive layer 6 on the −Z side. Therefore, an electric field concentration may occur at the corner portion of a +Z side surface 6a of the conductive layer 6 of the dummy word line DWL1. As a result, a back-tunneling phenomenon may occur in which charges that tunnel through the insulating film BLK1 from the corner portion of the +Z side surface 6a of the conductive layer 6 for the dummy word line DWL1 are stored in the charge storage film CT near the joint portion 4b. The flow of charges stored in the charge storage film CT by tunneling through the insulating film BLK1 is also called a back-tunneling current. When the back-tunneling phenomenon occurs, unintended information may be written into the charge storage film CT near the joint portion 4b, but it is also difficult to erase charges by injecting opposite charges from the semiconductor film CH into the charge storage film CT since the conductive layer 6 of any word line WL is absent near the joint portion 4b.

As for the conductive layer 6 for the word line WL4, the Z-direction interval GW4D1 to the adjacent conductive layer 6 on the +Z side is equal to a Z-direction interval GW3W4 to the adjacent conductive layer 6 on the −Z side. As a result, electric field concentration such as may occur for the conductive layer 6 of the dummy word line DWL1 is unlikely to occur with the conductive layer 6 for the word line WL4.

Figure 6:
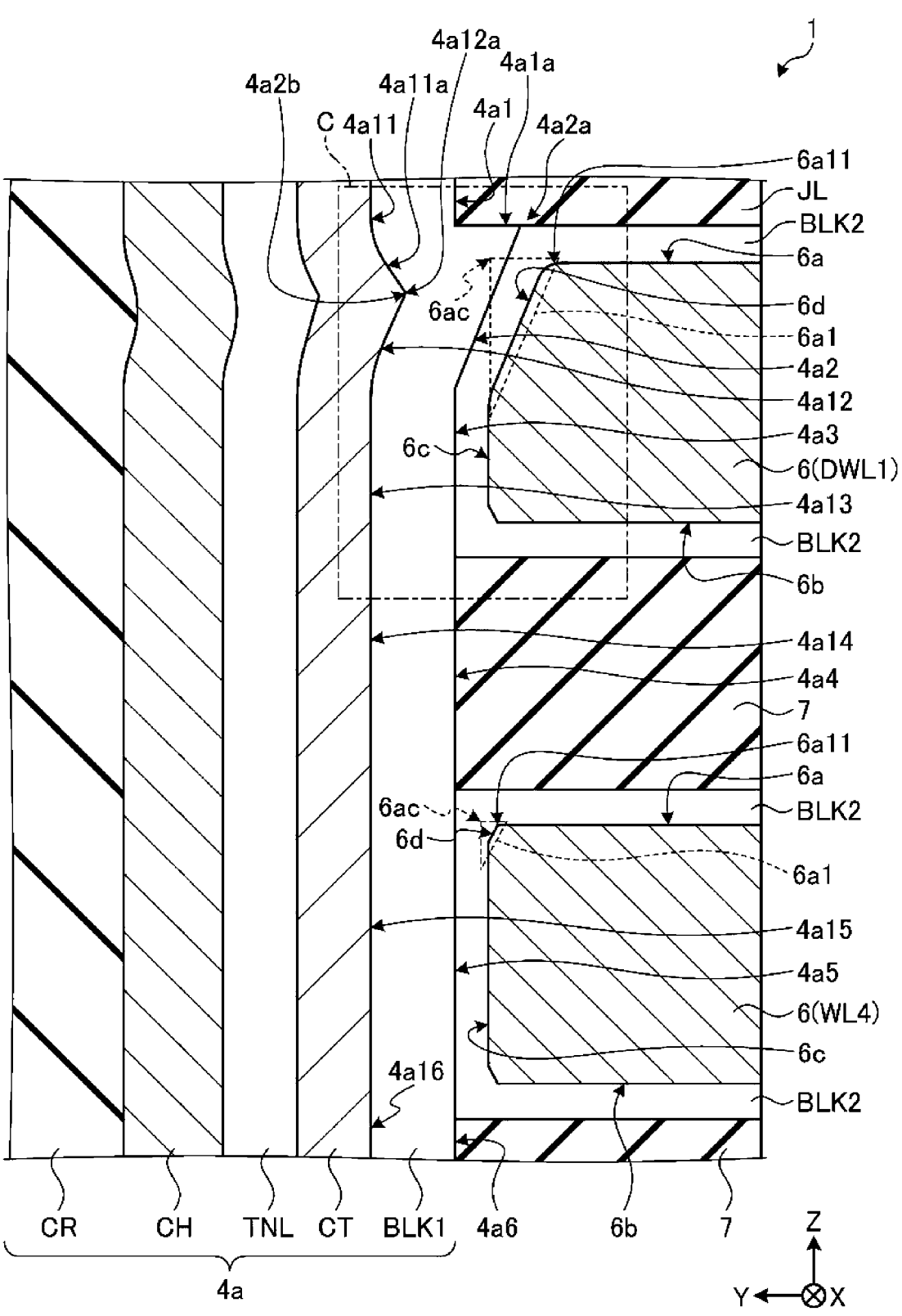
FIG. 6 is a cross-sectional view illustrating an upper corner region of a conductive layer in a first embodiment.

As such, the semiconductor device 1 is configured such that the vicinity of the portion of the conductive layer 6 for the dummy word line DWL1 facing the charge storage film CT has a missing portion at a corner, as illustrated in FIG. 6. FIG. 6 is an enlarged cross-sectional view illustrating the configuration of the missing portion of the +Z side (upper) corner of the conductive layer 6 for the dummy word line DWL1 and is a cross-sectional view in which the region B of FIG. 5 is illustrated in an enlarged manner.

In other words, in a cross-sectional view in the Z direction including the charge storage film CT, the semiconductor film CH, and the conductive layer 6, the missing amount of the +Z side corner at the part where the conductive layer 6 of the dummy word line DWL1 of the stacked body SST1 faces the charge storage film CT is larger than the missing amount of the +Z side corner at the part where the conductive layer 6 of the word line WL4 of the stacked body SST1 faces the charge storage film CT. Likewise, the missing amount of the +Z side corner at the part where the conductive layer 6 of the dummy word line DWL1 of the stacked body SST1 faces the charge storage film CT is larger than the missing amount of the +Z side corner at the part where the conductive layer 6 of the word lines WL3, WL2, WL1, and WL0 of the stacked body SST1 faces the charge storage film CT (see FIG. 4).

In the YZ cross section illustrated in FIG. 6, the intersection point at which the extended surface of the +Z side surface 6a of the conductive layer 6 and the extended surface of a tier 4a side end surface 6c intersect on the +Z side is defined as 6ac. The shape part specified by the intersection point 6ac and a +Z side surface 6d of the conductive layer 6 will be referred to as a missing portion 6a1. The missing portion 6a1 has a substantially triangular shape in a YZ cross-sectional view including the central axis CA1. The missing portion 6a1 of the +Z side corner of the conductive layer 6 of the dummy word line DWL1 is larger in dimension than the missing portion 6a1 of the +Z side corner of the conductive layer 6 of the word line WL4. The missing amount of the corner may be specified as the dimension of the missing portion 6a1 or may be specified as the dimension of a shape part similar to the missing portion 6a1.

For example, at the Z position corresponding to the +Z side corner of the conductive layer 6 of the dummy word line DWL1, a protrusion portion 4a12a is disposed on the outside surface of the charge storage film CT in the tier 4a, a recess portion 4a2b is disposed on the inside surface of the insulating film BLK1, and a protrusion portion 4a2a is disposed on the outside surface of the insulating film BLK1. Correspondingly, the +Z side surface 6d of the conductive layer 6 is configured to be retracted to the outside from the side surface of the tier 4a.

The outer peripheral surface of the insulating film BLK1 at the Z position corresponding to the +Z side of the conductive layer 6 of the dummy word line DWL1 is 4a2, and the outer peripheral surface of the insulating film BLK1 at the Z position slightly higher than the Z position is 4a1. The outer peripheral surface of the insulating film BLK1 at the Z position corresponding to the −Z side of the conductive layer 6 of the dummy word line DWL1 is 4a3, and the outer peripheral surface of the insulating film BLK1 at the Z position slightly lower than the Z position is 4a4. The outer peripheral surface of the insulating film BLK1 at the Z position slightly lower than the Z position is 4a5. The outer peripheral surface of the insulating film BLK1 at the Z position slightly lower than the Z position is 4a6. The outer peripheral surfaces of the charge storage film CT corresponding to the outer peripheral surfaces 4a1, 4a2, 4a3, 4a4, 4a5, and 4a6 are 4a11, 4a12, 4a13, 4a14, 4a15, and 4a16, respectively.

The outer peripheral surfaces 4a1, 4a3, 4a4, 4a5, and 4a6 form an integral surface or are on the extended surface of another surface and form a first reference outer peripheral surface. The outer peripheral surface 4a2 is positioned outside the first reference outer peripheral surface. The outer peripheral surfaces 4a11, 4a13, 4a14, 4a15, and 4a16 form an integral surface or are on the extended surface of another surface and form a second reference outer peripheral surface. The outer peripheral surface 4a12 is positioned outside the second reference outer peripheral surface. Accordingly, the +Z side corner at the part where the conductive layer 6 of the dummy word line DWL1 faces the charge storage film CT is missing to a position retracted further outward from the first reference outer peripheral surface as compared with the +Z side corner of the corresponding word line WL4.

There is almost no step surface between the outer peripheral surface 4a4 and the outer peripheral surface 4a5. There is almost no step surface between the outer peripheral surface 4a14 and the outer peripheral surface 4a15. Accordingly, at the +Z side corner at the part where the conductive layer 6 of the word line WL4 faces the charge storage film CT, the missing portion 6a1 retracted further outward from the first reference outer peripheral surface is not substantially formed.

Alternatively, at the +Z side corner of the conductive layer 6 of the word line WL4, the missing portion 6a1 having a substantially right-angled triangular shape in a YZ cross-sectional view is formed with a relatively small dimension.

A step surface 4a1a extending away from the first reference outer peripheral surface to the outside in the XY direction is formed between the outer peripheral surface 4a1 and the outer peripheral surface 4a2, and an inclined surface 4a11a extending with a slight inclination outside the second reference outer peripheral surface is formed between the outer peripheral surface 4a11 and the outer peripheral surface 4a12. Accordingly, at the +Z side corner of the conductive layer 6 at the part where the dummy word line DWL1 faces the charge storage film CT, the missing portion 6a1 having a substantially right-angled triangular shape in a YZ cross-sectional view is formed with a relatively large dimension.

In other words, the XY-direction missing amount of the +Z side corner of the conductive layer 6 for the dummy word line DWL1 is larger than the XY-direction missing amount of the +Z side corner of the conductive layer 6 of the word line WL4. Likewise, the XY-direction missing amount of the +Z side corner of the conductive layer 6 for the dummy word line DWL1 is larger than the XY-direction missing amount of the +Z side corner of the conductive layer 6 for the word lines WL3, WL2, WL1, and WL0.

Accordingly, it can be ensured that the XY-direction distance between an end portion 6a11 of the +Z side surface 6a of the conductive layer 6 for the dummy word line DWL1 and the charge storage film CT is larger than the XY-direction distance between the end portion 6a11 of the +Z side surface 6a of the conductive layer 6 for the word lines WL4, WL3, WL2, WL1, and WL0 and the charge storage film CT. As a result, it is possible to prevent the back-tunneling phenomenon between the conductive layer 6 of the dummy word line DWL1 and the charge storage film CT near the joint portion 4b in the erasing processing.

Figure 7:
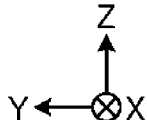
FIG. 7 is a cross-sectional view illustrating parameters for a missing amount of a corner region in a first embodiment.

Next, parameters for describing the missing amount of the corner of the conductive layer 6 for the dummy word line DWL1 will be examined. As described above, the missing amount of the corner may be defined as the dimension of the missing portion 6a1 of the +Z side corner of the conductive layer 6 or may be defined as the dimension of a shape part similar to the missing portion 6a1. The missing amount of the corner may be defined using parameters as illustrated in FIG. 7. FIG. 7 is a cross-sectional view illustrating parameters for defining the missing amount of a corner and is an enlarged cross-sectional view of the region C of FIG. 6.

As illustrated in FIG. 7, when a film thickness of the insulating film BLK2 is substantially uniform, a missing portion 106a1 of the +Z side corner of the insulating film BLK2 faced the charge storage film CT via the insulating film BLK1 is substantially similar in shape to the missing portion 6a1 of the +Z side corner of the conductive layer 6. By defining the shape and dimension of the missing portion 106a1, the shape and dimension of the missing portion 6a1 can be indirectly defined and the missing amount of the +Z side corner of the conductive layer 6 can be defined. The similitude ratio (similarity ratio) between the missing portion 106a1 and the missing portion 6a1 is close to 1, and thus the missing portion 106a1 and the missing portion 6a1 can be regarded as approximately congruent.

In a cross section including the charge storage film CT and the conductive layer 6, the XY-direction length of the +Z side end of the missing portion 106a1 is Δx. Δx indicates the XY-direction missing amount of the +Z side corner of the conductive layer 6. The Z height of the missing portion 106a1 is Δz. Δz indicates the Z-direction missing amount of the +Z side corner of the conductive layer 6. The Z-direction thickness of the conductive layer 6 is WWL. An XY-direction thickness of the insulating film BLK1 between the end portion of a −Z side surface 6b of the conductive layer 6 and the charge storage film CT is tBLK1. An XY-direction thickness of the insulating film BLK2 between the end portion of the −Z side surface 6b of the conductive layer 6 and the charge storage film CT is tBLK2.

Figure 8A:
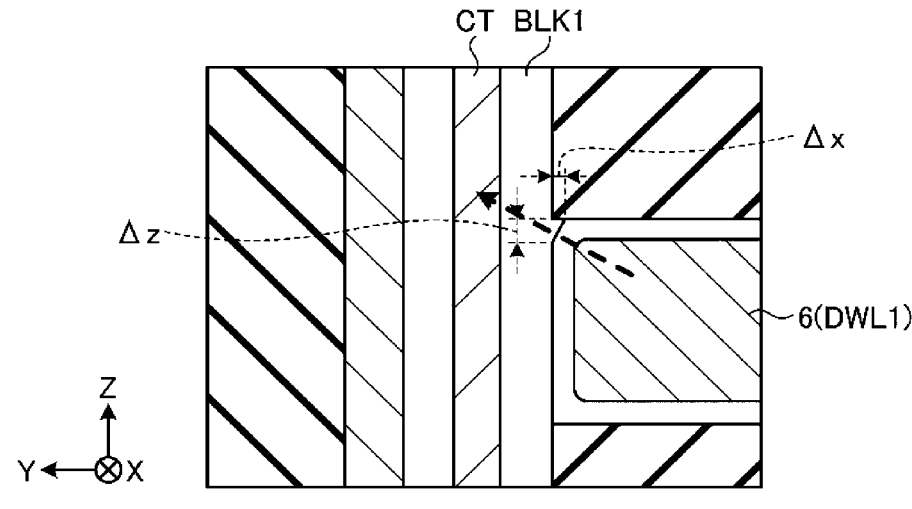
FIGS. 8A to 8C are cross-sectional views illustrating a shape of the missing portion when the missing amount of the corner is changed in the first embodiment.
Figure 8B:
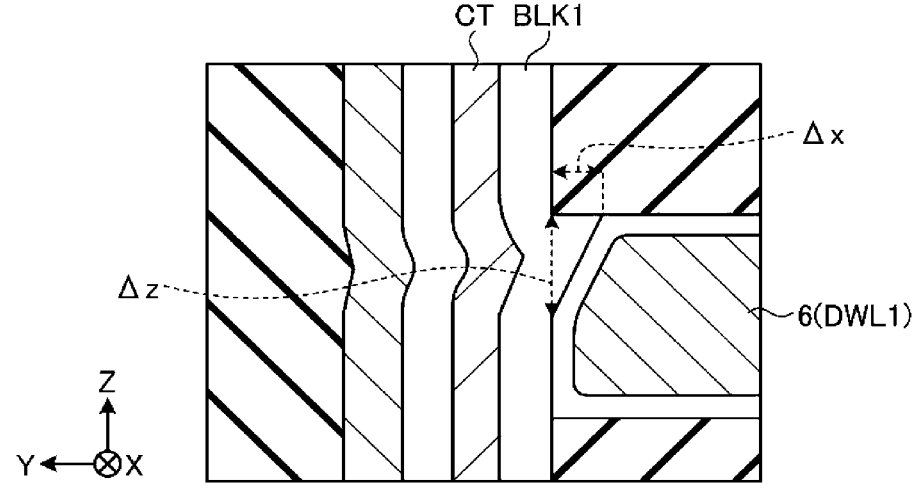
Figure 8C:
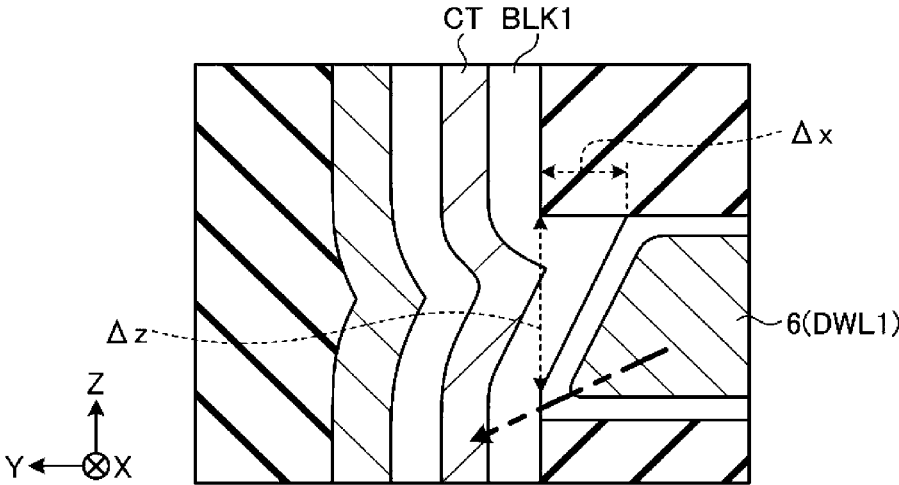

For example, by changing the XY-direction missing amount Δx and the Z-direction missing amount Δz while maintaining Δz/Δx=tan 65°, the missing portion 6a1 of the +Z side corner of the conductive layer 6 for a dummy word line DW1 has a shape as illustrated in FIGS. 8A to 8C. FIGS. 8A to 8C are cross-sectional views illustrating the shape of the missing portion when the missing amount of the +Z side corner of the conductive layer 6 for the dummy word line DW1 is changed. FIG. 8A illustrates a case where both the XY-direction missing amount Δx and the Z-direction missing amount Δz are approximately 0 and the missing amount of the corner is relatively small. FIG. 8C illustrates a case where the Z-direction missing amount Δz is approximately WWL, the XY-direction missing amount Δx is an amount corresponding thereto, and the missing amount of the corner is relatively large. FIG. 8B illustrates a case where each of the XY-direction missing amount Δx and the Z-direction missing amount Δz is an intermediate amount and the missing amount of the corner is an intermediate amount.

Regarding each of FIGS. 8A to 8C, the current density distribution during an erasing operation in the vicinity of the conductive layer 6 for the dummy word line DW1 was simulated and the following results were obtained.

In the case of FIG. 8A, a back-tunneling current tunneling through the insulating film BLK1 obliquely upward from the +Z side corner of the conductive layer 6 and flowing to the charge storage film CT was observed as indicated by the dotted arrow. It is considered that this is because the missing amount of the +Z side corner was insufficient and electric field concentration occurred at the +Z side corner during the erasing operation to result in back-tunneling current generation. In the case of FIG. 8A, there is a possibility that the missing amount of the +Z side corner is insufficient with respect to an appropriate value.

In the case of FIG. 8C, a back-tunneling current tunneling through the insulating film BLK1 obliquely downward from the −Z side corner of the conductive layer 6 and flowing to the charge storage film CT was observed as indicated by the dashed-dotted arrow. It is considered that this is because the missing amount of the +Z side corner was excessive and electric field concentration occurred at the −Z side corner during the erasing operation to result in back-tunneling current generation. In the case of FIG. 8C, there is a possibility that the missing amount of the +Z side corner is excessive with respect to an appropriate value.

In the case of FIG. 8B, almost no back-tunneling current was observed. It is considered that this is because the missing amount of the +Z side corner was an appropriate value, electric field concentration was unlikely to occur at the −Z side corner during the erasing operation, and a back-tunneling current was reduced.

From these results, it is possible that there is an appropriate range for the missing amount of the corner.

Next, the definition of the appropriate range of the missing amount of the corner will be examined.

Figure 9A:
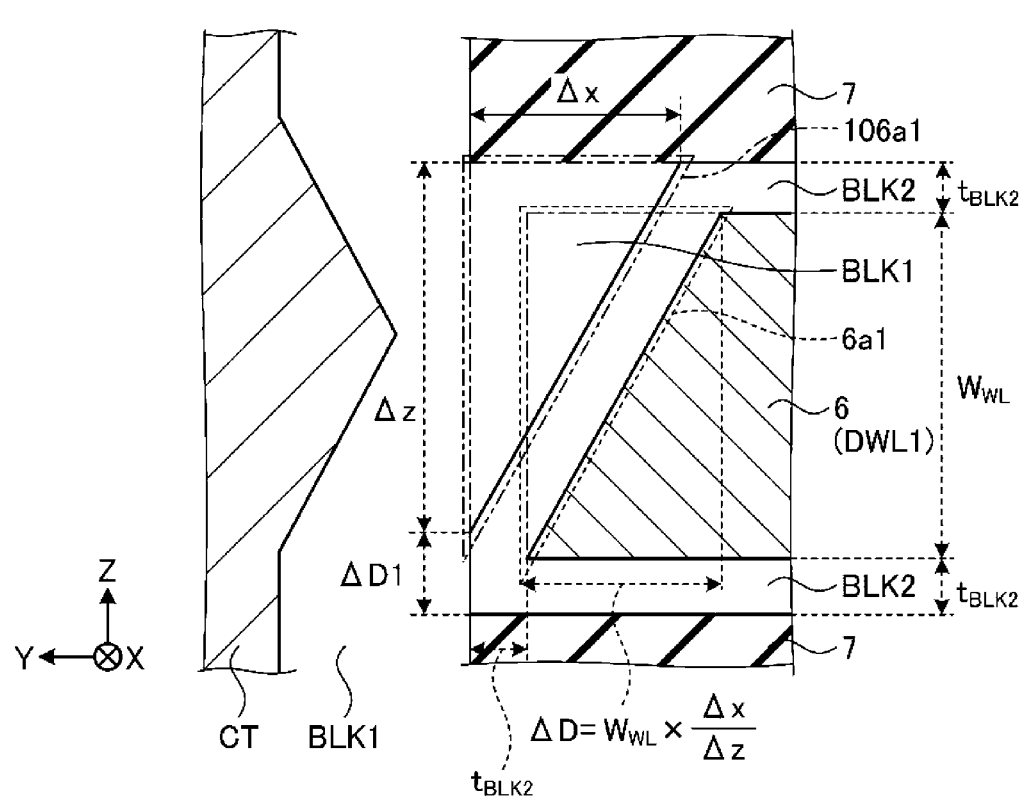
FIGS. 9A and 9B are cross-sectional views illustrating an upper limit of $\Delta z$ and an upper limit of $\Delta x$ in the first embodiment.
Figure 9B:
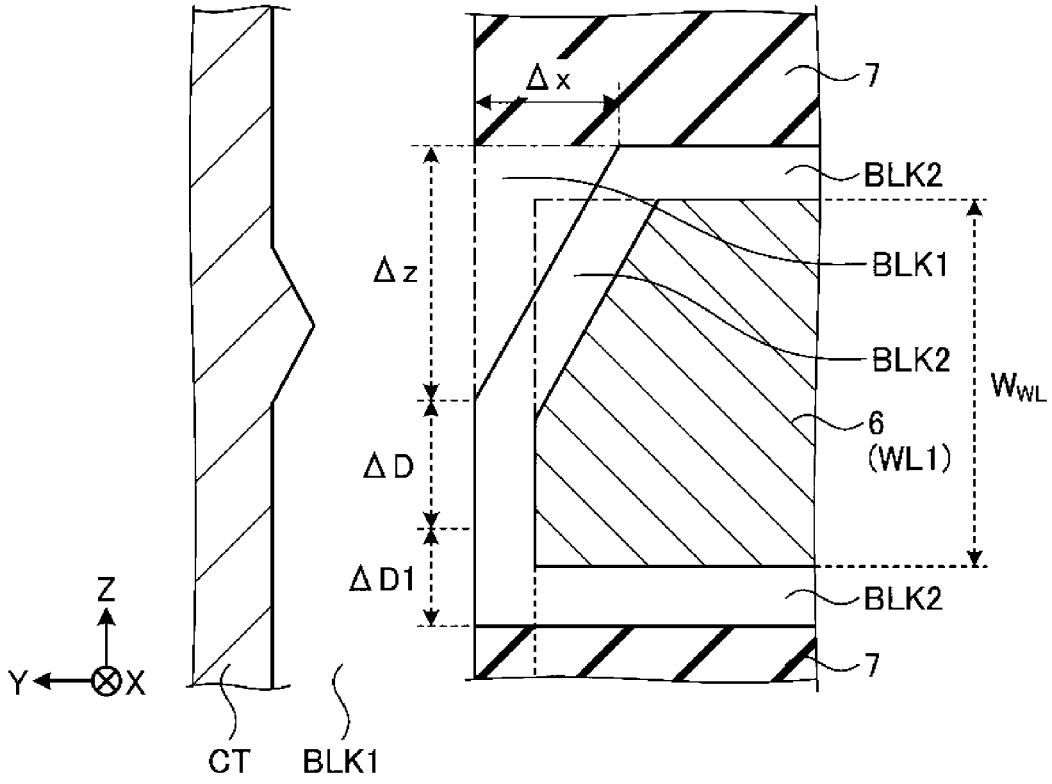

First, the upper limit of the appropriate range of the Z-direction missing amount Δz will be examined as illustrated in FIGS. 9A and 9B. FIGS. 9A and 9B are cross-sectional views illustrating a definition of an upper limit of Δz (upper limit of Δx).

Although it is an empirical rule, Δz at which the −Z side end of the missing portion 106a1 is positioned at the Z position on the +Z side as compared with the −Z side end of the conductive layer 6 and that is approximately equal to Δx in a state where Δz reaches the −Z side end of the conductive layer 6 is the upper limit of Δz.

For example, when the missing portion 6a1 of the +Z side corner of the conductive layer 6 reaches the −Z side end of the conductive layer 6, the Z height of the missing portion 6a1 is equal to the Z-direction thickness WWL of the conductive layer 6 as illustrated in FIG. 9A. The thickness tBLK2 of the insulating film BLK2 is uniform, and the missing portion 106a1 can be approximately regarded as the missing portion 6a1 translated by tBLK2 in each of the XY and Z directions. In other words, the missing portion 6a1 and the missing portion 106a1 can be regarded as approximately congruent. In this case, the following Expression 1 holds since the Z height of the missing portion 6a1 and the Z height of the missing portion 106a1 are substantially equal. In FIG. 9A, the −Z side end of Δz is indicated as the Z position at a Z-direction distance ΔD1 tBLK2 from the −Z side surface of the −Z side insulating film BLK2.

$$\Delta z \approx W_{WL} \qquad \text{(Expression 1)}$$

At this time, since the ratio of the XY-direction length to the Z height of the missing portion 6a1 is equal to the ratio of the XY-direction length to the Z height of the missing portion 106a1 (Δx/Δz), the XY-direction length ΔD of the missing portion 6a1 is represented by the following Expression 2:

$$\Delta D = W_{WL} \times \Delta x / \Delta z \qquad \text{(Expression 2)}$$

By shortening Δz illustrated in FIG. 9A by ΔD while keeping Δz/Δx constant, Δz as illustrated in FIG. 9B is obtained as the upper limit of Δz. Assuming that the upper limit of Δz is Δzth, the upper limit Δzth of Δz is indicated by the following Expression 3 from Expressions 1 and 2:

$$\Delta z_{th} = W_{WL} - \Delta D = W_{WL}(1 - \Delta x / \Delta z) \qquad \text{(Expression 3)}$$

Indicating this as the definition of the upper limit of the Z-direction missing amount Δz results in Expression 4:

$$\Delta z < \Delta z_{th} \qquad \text{(Expression 4)}$$

Since Δz/Δx is kept constant, the definition of the upper limit of Δz can be rewritten as the definition of the upper limit of Δx. By solving the inequality obtained by Expressions 3 and 4 for Δx, the following Expression 5 is obtained as the definition of the upper limit of Δx:

$$\Delta x < \Delta z (1 - \Delta z / W_{WL}) \qquad \text{(Expression 5)}$$

Figure 10A:
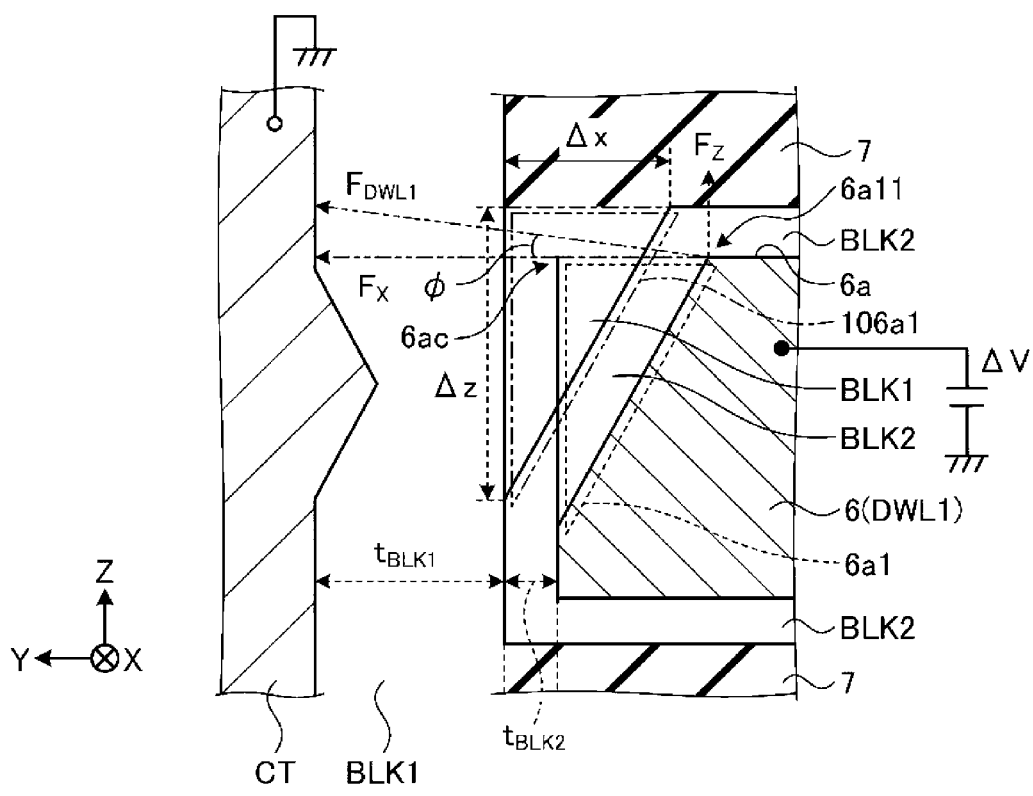
FIGS. 10A and 10B are cross-sectional views illustrating a lower limit of $\Delta x$ and a lower limit of $\Delta z$ in the first embodiment.
Figure 10B:
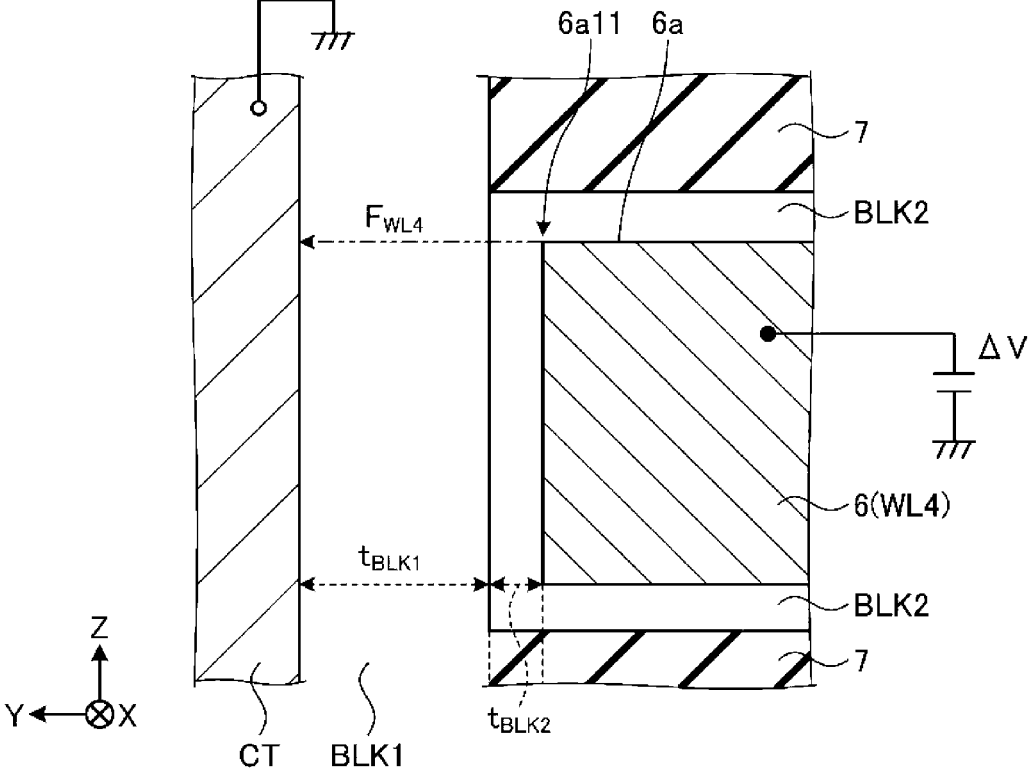

Next, the lower limit of the appropriate range of the XY-direction missing amount Δx will be examined as illustrated in FIGS. 10A and 10B. FIGS. 10A and 10B are cross-sectional views illustrating a definition of a lower limit of Δx (lower limit of Δz).

The value of Δx at which the electric field at the end portion 6a11 of the +Z side surface 6a of the conductive layer 6 for the dummy word line DWL1 becomes weaker than the electric field at the end portion 6a11 of the +Z side surface 6a of the conductive layer 6 for the word line WL4 is the lower limit of Δx.

For example, in FIG. 10A, when 0 V is applied to the charge storage film CT and a voltage ΔV is applied to the dummy word line DWL1, an electric field FDWL1 from the end portion $6a11$ of the +Z side surface $6a$ of the dummy word line DWL1 toward the charge storage film CT is generated. Assuming that the XY-direction component of the electric field FDWL1 is FX and the Z-direction component of the electric field FDWL1 is FZ, the electric field FDWL1 is given by the following Expression 6.

$$F_{DWL1} = (Fx^2 + Fz^2)^{1/2} \qquad \text{(Expression 6)}$$

When the insulating film BLK1 is formed of silicon oxide and the insulating film BLK2 is formed of aluminum oxide, effective electrical film thicknesses when physical film thicknesses tBLK1 and tBLK2 of the insulating films BLK1 and BLK2 are converted into silicon oxide films are tBLK1 and tBLK2/2.6, respectively. Assuming that the missing portion $6a1$ and the missing portion $106a1$ are approximately congruent and the physical film thickness tBLK1 of the insulating film BLK1 is approximately uniform, the XY-direction component FX is given by the following Expression 7:

$$Fx = \Delta V/(t_{BLK1} + t_{BLK2}/2.6 + \Delta x) \qquad \text{(Expression 7)}$$

Each of the electric field FDWL1, the XY-direction component FX, and the Z-direction component FZ is a vector quantity. Assuming that the angle formed by the electric field FDWL1 and the XY-direction component FX is 0, the Z-direction component FZ is given by the following Expression 8:

$$Fz = [\Delta V/\{(t_{BLK1} + t_{BLK2}/2.6 + \Delta x)/\cos \Phi\}] \times \sin \Phi \qquad \text{(Expression 8)}$$

From Expressions 7 and 8, the Z-direction component FZ can be rewritten as the following Expression 9:

$$F_z = F_X \sin \Phi \cos \Phi \le 0.5 F_X \qquad \text{(Expression 9)}$$

From Expressions 6 to 9, the relationship of the following Expression 10 is derived:

$$F_{DWL1} < \{F_X^2 + (0.5F_X)^2\}^{1/2} = (1.25F_X^2)^{1/2} = \sqrt{(1.25)} \\ F_X = \sqrt{(1.25)}\Delta V/(t_{BLK1} + t_{BLK2}/2.6 + \Delta x) \qquad \text{(Expression 10)}$$

In FIG. 10B, when 0 V is applied to the charge storage film CT and the voltage $\Delta V$ is applied to the conductive layer 6 of the word line WL4, an electric field FWL4 from the end portion $6a11$ of the +Z side surface $6a$ of the conductive layer 6 for the word line WL4 toward the charge storage film CT is generated.

When the insulating film BLK1 is formed of silicon oxide and the insulating film BLK2 is formed of aluminum oxide, the effective electrical film thicknesses when the physical film thicknesses tBLK1 and tBLK2 of the insulating films BLK1 and BLK2 are converted into silicon oxide films are tBLK1 and tBLK2/2.6, respectively. The electric field FWL4 is given by the following Expression 11:

$$F_{WL4} = \Delta V/(t_{BLK1} + t_{BLK2}/2.6) \qquad \text{(Expression 11)}$$

From Expressions 10 and 11, the condition that the electric field FDWL1 becomes weaker than the electric field FWL4 is given by the following Expression 12:

$$\sqrt{(1.25)}\Delta V/(t_{BLK1} + t_{BLK2}/2.6 + \Delta x) < \Delta V/(t_{BLK1} + t_{BLK2}/2.6) \qquad \text{(Expression 12)}$$

By solving Expression 12 for $\Delta x$, the following Expression 13 is obtained:

$$\Delta x > \{\sqrt{(1.25)} - 1\}(t_{BLK1} + t_{BLK2}/2.6) \qquad \text{(Expression 13)}$$

Assuming that the lower limit of $\Delta x$ is $\Delta x$th, the definition of the lower limit $\Delta x$th of $\Delta x$ is indicated by the following Expression 14:

$$\Delta x > \Delta x_{th} \qquad \text{(Expression 14)}$$

By changing $\Delta x$ while keeping $\Delta z/\Delta x$ constant, the definition of the lower limit of $\Delta x$ can be rewritten as the definition of the lower limit of $\Delta z$ as in the following Expression 15:

$$\Delta z > (\Delta z/\Delta x)\Delta x_{th} = (\Delta z/\Delta x)\{\sqrt{(1.25)} - 1\} \\ (t_{BLK1} + t_{BLK2}/2.6) \qquad \text{(Expression 15)}$$

By examining FIGS. 9A to 10B, the following Expressions 16 and 17 are obtained as the appropriate ranges of $\Delta x$ and $\Delta z$:

$$\Delta x_{th} = \{\sqrt{(1.25)} - 1\}(t_{BLK1} + t_{BLK2}/2.6) < \Delta x < \Delta z(1 - \Delta z/ \\ W_{WL}) \qquad \text{(Expression 16)}$$

$$(\Delta z/\Delta x)\Delta x_{th} = (\Delta z/\Delta x)\{\sqrt{(1.25)} - 1\}(t_{BLK1} + t_{BLK2}/2.6) \\ < \Delta z < \Delta z_{th} = W_{WL}(1 - \Delta x/\Delta z) \qquad \text{(Expression 17)}$$

Alternatively, the following Expression 18 holds when the XY-direction thickness tBLK2 of the insulating film BLK2 is sufficiently smaller than the XY-direction thickness tBLK1 of the insulating film BLK1 or when the insulating film BLK2 is omitted.

$$t_{BLK1} + t_{BLK2}/2.6 \approx t_{BLK1} \qquad \text{(Expression 18)}$$

By applying Expression 18 to Expressions 16 and 17, the following Expressions 19 and 20 are obtained as the appropriate ranges of $\Delta x$ and $\Delta z$:

$$\Delta x_{th} = \{\sqrt{(1.25)} - 1\}t_{BLK1} < \Delta x < \Delta z(1 - \Delta z/W_{WL}) \qquad \text{(Expression 19)}$$

$$(\Delta z/\Delta x)\Delta x_{th} = (\Delta z/\Delta x)\{\sqrt{(1.25)} - \\ 1\}t_{BLK1} < \Delta z < \Delta z_{th} = W_{WL}(1 - \Delta x/\Delta z) \qquad \text{(Expression 20)}$$

Figure 11:
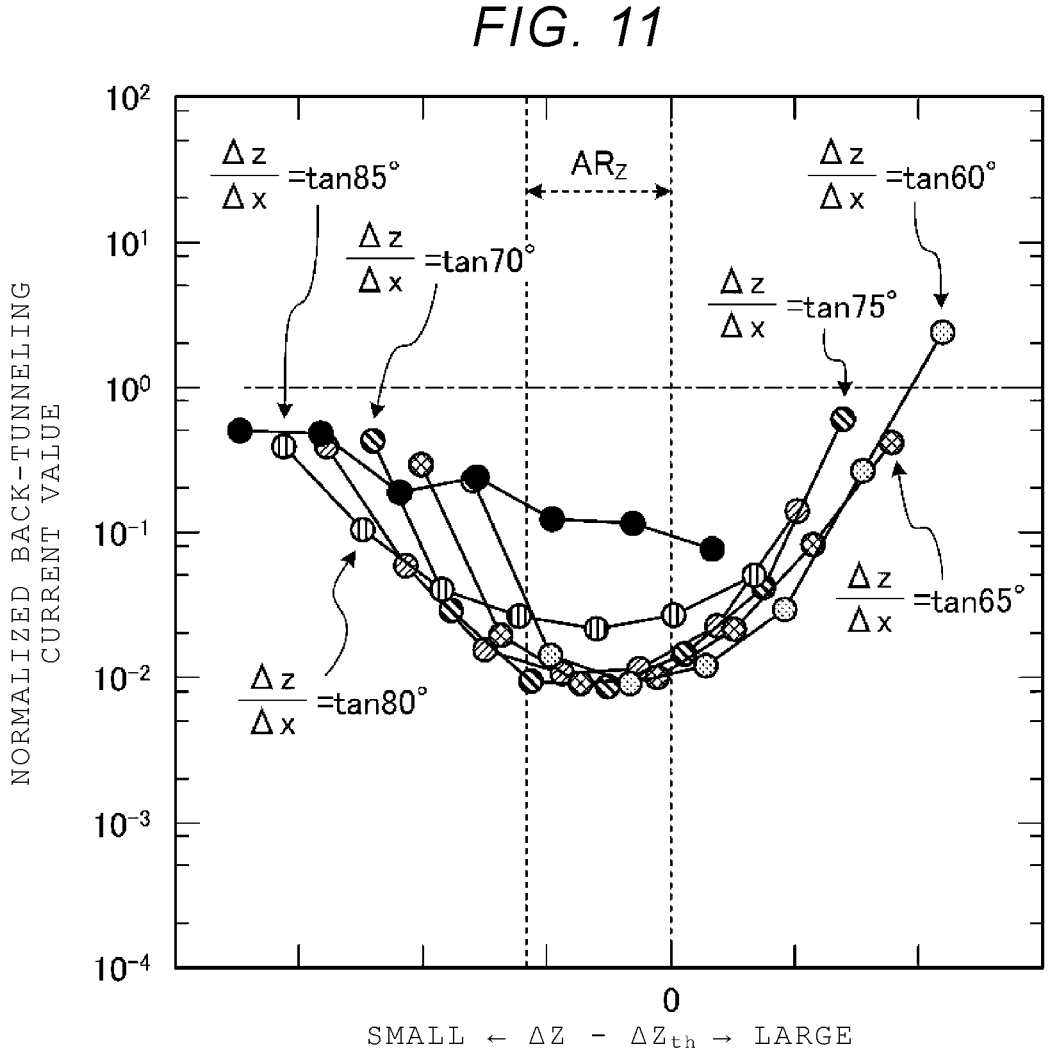
FIG. 11 is a diagram illustrating characteristics of a back-tunneling current when $\Delta z$ is changed in the first embodiment.

For example, FIG. 11 illustrates the results of a simulation performed by changing $\Delta z$ while keeping $\Delta z/\Delta x$ constant with regard to the back-tunneling current from the conductive layer 6 for the dummy word line DWL1 to the charge storage film CT. FIG. 11 is a diagram illustrating characteristics of the back-tunneling current when $\Delta z$ is changed. In FIG. 11, the vertical axis indicates the normalized back-tunneling current value and the horizontal axis indicates $\Delta z - \Delta z_{th}$. In FIG. 11, an allowable upper limit value of the back-tunneling current is indicated by a dashed-dotted line. In FIG. 11, plots with the same $\Delta z/\Delta x$ are line-connected.

For example, it is illustrated that by changing $\Delta z$ while maintaining $\Delta z/\Delta x = \tan 60°$, the back-tunneling current is reliably reduced to the allowable upper limit value or less in an appropriate range ARz of $\Delta z$. The appropriate range ARz is given by Expression 17 or Expression 20 above. In FIG. 11, the upper limit of the appropriate range ARz is indicated by zero as the value obtained by subtracting $\Delta z_{th}$ from the upper limit of Expression 17 or Expression 20. The lower limit of the appropriate range ARz is the value obtained by subtracting $\Delta z_{th}$ from the lower limit of Expression 17 or Expression 20.

It is illustrated that by changing $\Delta z$ while maintaining $\Delta z/\Delta x = \tan 65°$, the back-tunneling current is reliably reduced to the allowable upper limit value or less in the appropriate range ARz of $\Delta z$.

It is illustrated that by changing $\Delta z$ while maintaining $\Delta z/\Delta x = \tan 70°$, the back-tunneling current is reliably reduced to the allowable upper limit value or less in the appropriate range ARz of $\Delta z$.

It is illustrated that by changing $\Delta z$ while maintaining $\Delta z/\Delta x = \tan 75°$, the back-tunneling current is reliably reduced to the allowable upper limit value or less in the appropriate range ARz of $\Delta z$.

It is illustrated that by changing $\Delta z$ while maintaining $\Delta z/\Delta x = \tan 80°$, the back-tunneling current is reliably reduced to the allowable upper limit value or less in the appropriate range ARz of $\Delta z$.

It is illustrated that by changing $\Delta z$ while maintaining $\Delta z/\Delta x=\tan 85°$, the back-tunneling current is reliably reduced to the allowable upper limit value or less in the appropriate range ARz of $\Delta z$.

As a result, it is confirmed that the back-tunneling phenomenon can be effectively prevented by configuring the missing portion $6a1$ of the +Z side corner of the conductive layer 6 for the dummy word line DWL1 according to the appropriate range ARz of $\Delta z$.

Figure 12:
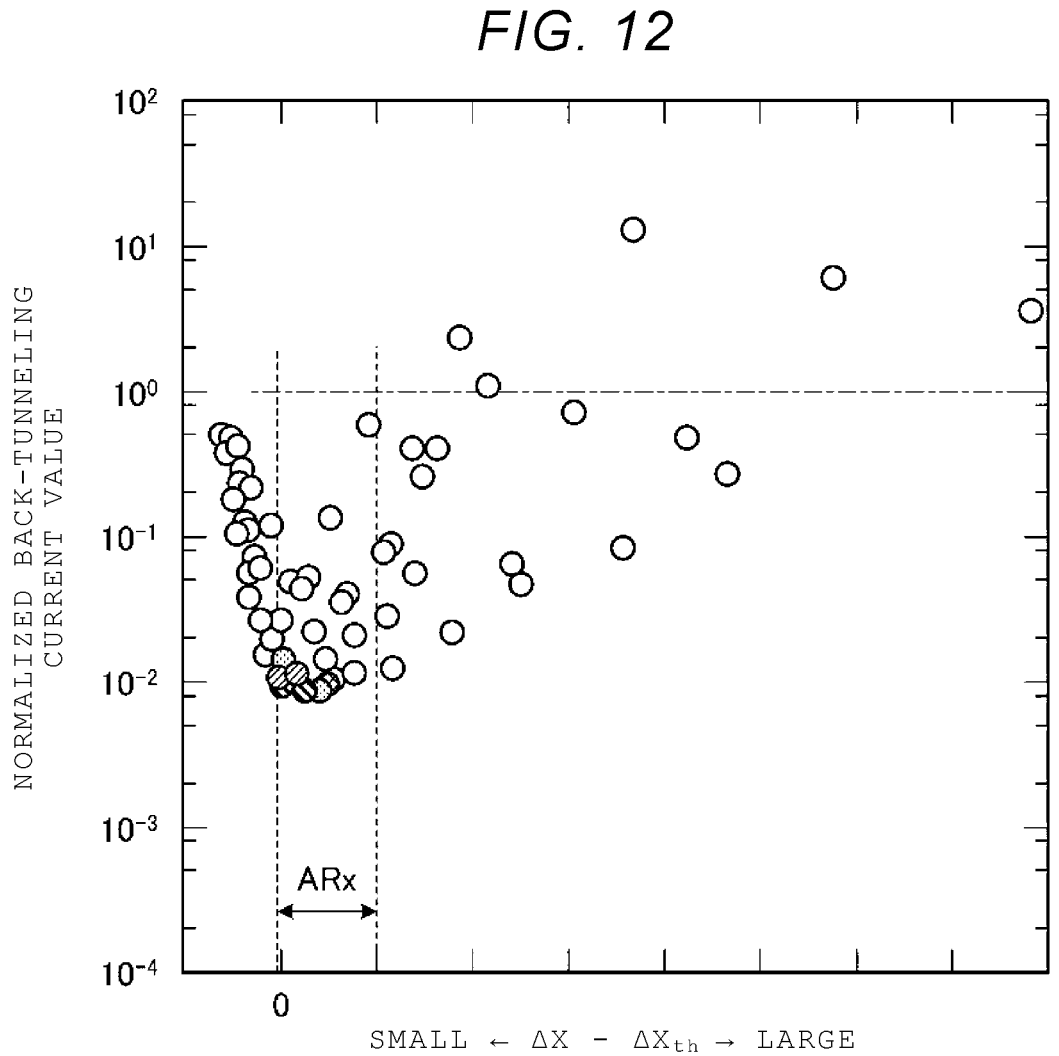
FIG. 12 is a diagram illustrating characteristics of a back-tunneling current when $\Delta x$ is changed in the first embodiment.

FIG. 12 is obtained by rewriting the simulation result illustrated in FIG. 11 as a simulation result regarding a change in $\Delta x$ using the value of $\Delta z/\Delta x$. FIG. 12 is a diagram illustrating characteristics of the back-tunneling current when $\Delta x$ is changed. In FIG. 12, the vertical axis indicates the normalized back-tunneling current value and the horizontal axis indicates $\Delta x-\Delta x$th. In FIG. 12, the allowable upper limit value of the back-tunneling current is indicated by a dashed-dotted line. In FIG. 12, plots with the same $\Delta z/\Delta x$ are not line-connected for depictional simplification.

It is illustrated that by changing $\Delta x$ while keeping $\Delta z/\Delta x$ at various values, the back-tunneling current is reliably reduced to the allowable upper limit value or less in an appropriate range ARx of $\Delta x$. The appropriate range ARx is given by Expression 16 or Expression 19 above. In FIG. 12, the lower limit of the appropriate range ARx is indicated by zero as the value obtained by subtracting $\Delta z_{th}$ from the lower limit of Expression 16 or Expression 19. The upper limit of the appropriate range ARx is the value obtained by subtracting $\Delta z_{th}$ from the upper limit of Expression 16 or Expression 19.

It is confirmed that the back-tunneling phenomenon can be effectively prevented by configuring the missing portion $6a1$ of the +Z side corner of the conductive layer 6 for the dummy word line DWL1 according to the appropriate range ARx of $\Delta x$.

Next, the validity of the appropriate range ARx will be confirmed.

Figure 13:
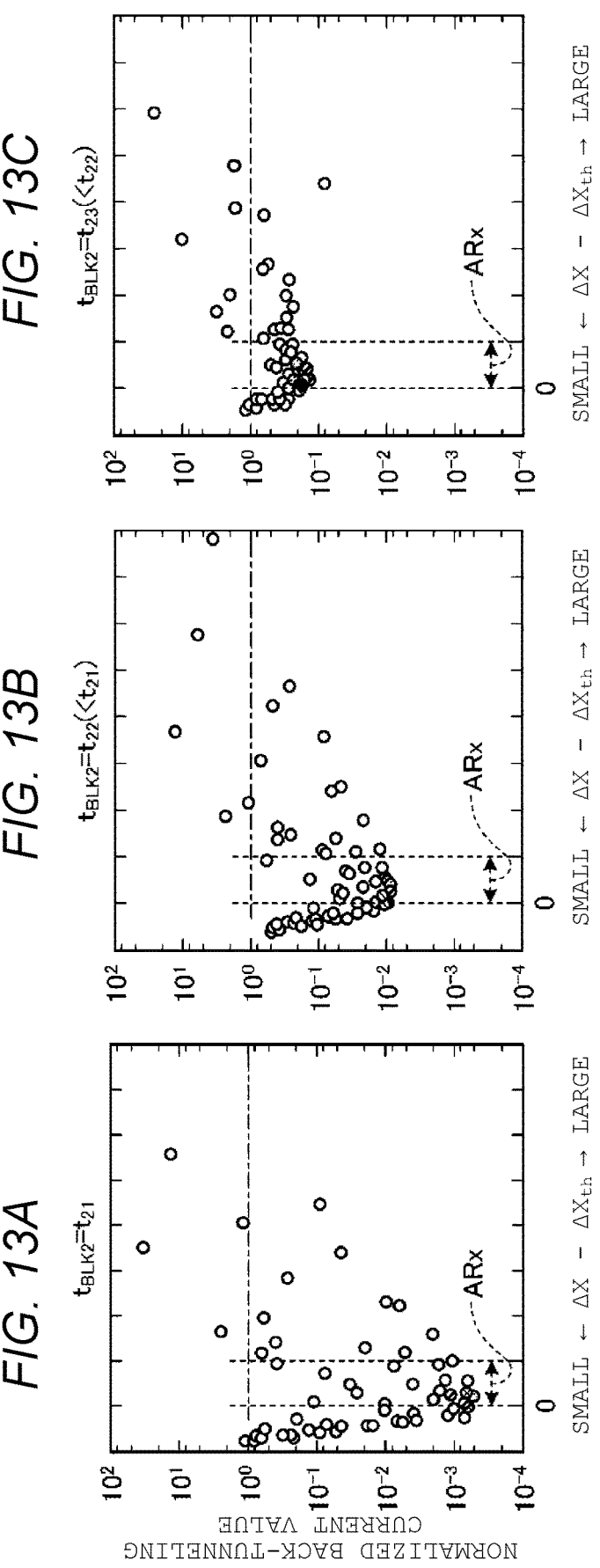
FIGS. 13A to 13C are diagrams illustrating characteristics of a back-tunneling current when a thickness of an insulating film is changed in the first embodiment.

FIGS. 13A to 13C is a diagram illustrating characteristics of the back-tunneling current when the thickness tBLK2 of the insulating film BLK2 is changed.

For example, FIG. 13A illustrates characteristics of the back-tunneling current when the thickness tBLK2 of the insulating film BLK2 is t21 (for example, 4 nm). It is illustrated that by changing $\Delta x$ while keeping $\Delta z/\Delta x$ at various values, the back-tunneling current is reliably reduced to the allowable upper limit value or less in the appropriate range ARx of $\Delta x$.

FIG. 13B illustrates characteristics of the back-tunneling current when the thickness tBLK2 of the insulating film BLK2 is smaller t22 (<t21, for example, 3 nm). It is illustrated that by changing $\Delta x$ while keeping $\Delta z/\Delta x$ at various values, the back-tunneling current is reliably reduced to the allowable upper limit value or less in the appropriate range ARx of $\Delta x$.

FIG. 13C illustrates characteristics of the back-tunneling current when the thickness tBLK2 of the insulating film BLK2 is even smaller t23 (<t22, for example, 2 nm). It is illustrated that by changing $\Delta x$ while keeping $\Delta z/\Delta x$ at various values, the back-tunneling current is reliably reduced to the allowable upper limit value or less in the appropriate range ARx of $\Delta x$.

It is confirmed from FIGS. 13A to 13C that when the thickness tBLK2 of the insulating film BLK2 is reduced from t21 to t22 and then to t23, the appropriate range ARx is valid and the back-tunneling current is reliably reduced to the allowable upper limit value or less.

Figure 14:
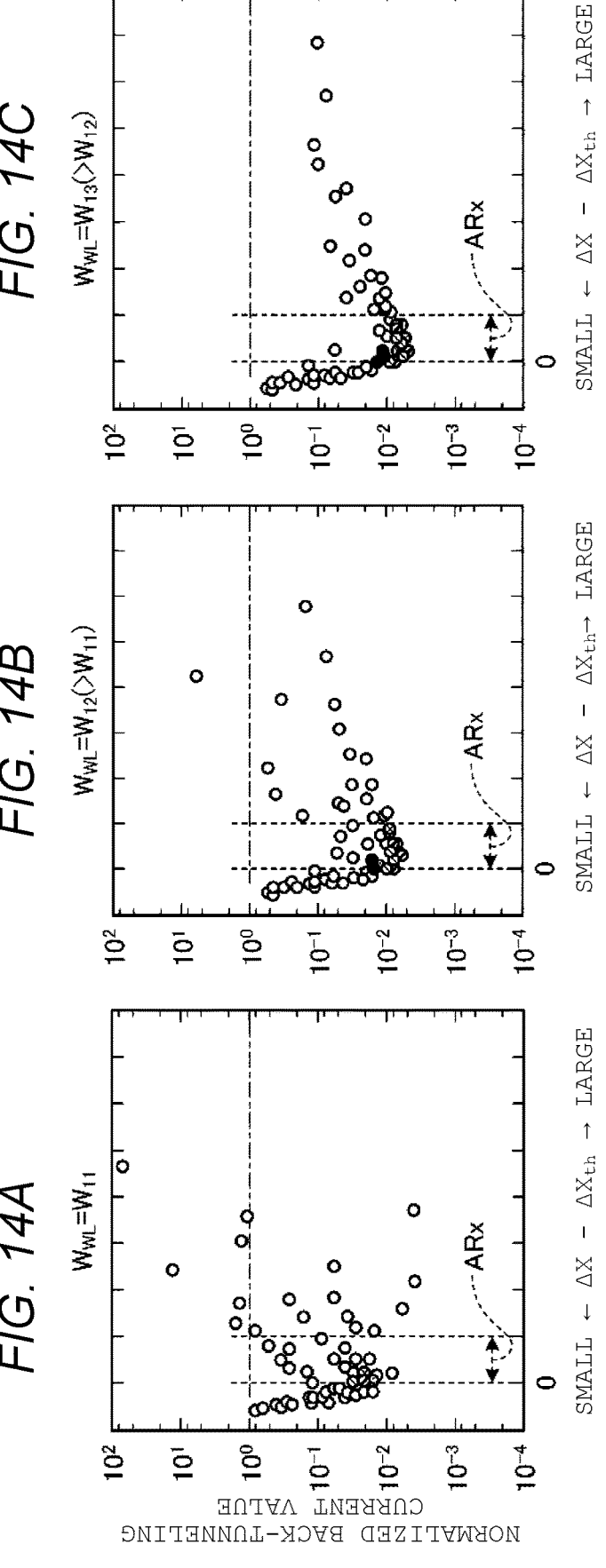
FIGS. 14A to 14C are diagrams illustrating characteristics of a back-tunneling current when a thickness of a conductive layer is changed in the first embodiment.

FIGS. 14A to 14C are diagrams illustrating characteristics of the back-tunneling current when a thickness of the conductive layer 6 for the dummy word line DWL1 is changed.

For example, FIG. 14A illustrates characteristics of the back-tunneling current when the thickness WWL of the conductive layer 6 for the dummy word line DWL1 is W11 (for example, 15 nm). It is illustrated that by changing $\Delta x$ while keeping $\Delta z/\Delta x$ at various values, the back-tunneling current is reliably reduced to the allowable upper limit value or less in the appropriate range ARx of $\Delta x$.

FIG. 14B illustrates characteristics of the back-tunneling current when the thickness WWL of the conductive layer 6 for the dummy word line DWL1 becomes larger value W12 (for example, 25 nm) (W12>W11). It is illustrated that by changing $\Delta x$ while keeping $\Delta z/\Delta x$ at certain values, the back-tunneling current can be reliably reduced to the allowable upper limit value or less in the appropriate range ARx of $\Delta x$.

FIG. 14C illustrates characteristics of the back-tunneling current when the thickness WWL of the conductive layer 6 of the dummy word line DWL1 becomes an even larger value W13 (for example, 30 nm) (W13>W12). It is illustrated that by changing $\Delta x$ while keeping $\Delta z/\Delta x$ at certain values, the back-tunneling current can be reliably reduced to the allowable upper limit value or less in the appropriate range ARx of $\Delta x$.

It is confirmed from FIGS. 14A to 14C that when the thickness WWL of the dummy word line DWL1 is increased from W11 to W12 and then to W13, the appropriate range ARx is valid and the back-tunneling current may be reliably reduced to the allowable upper limit value or less.

Figure 15:
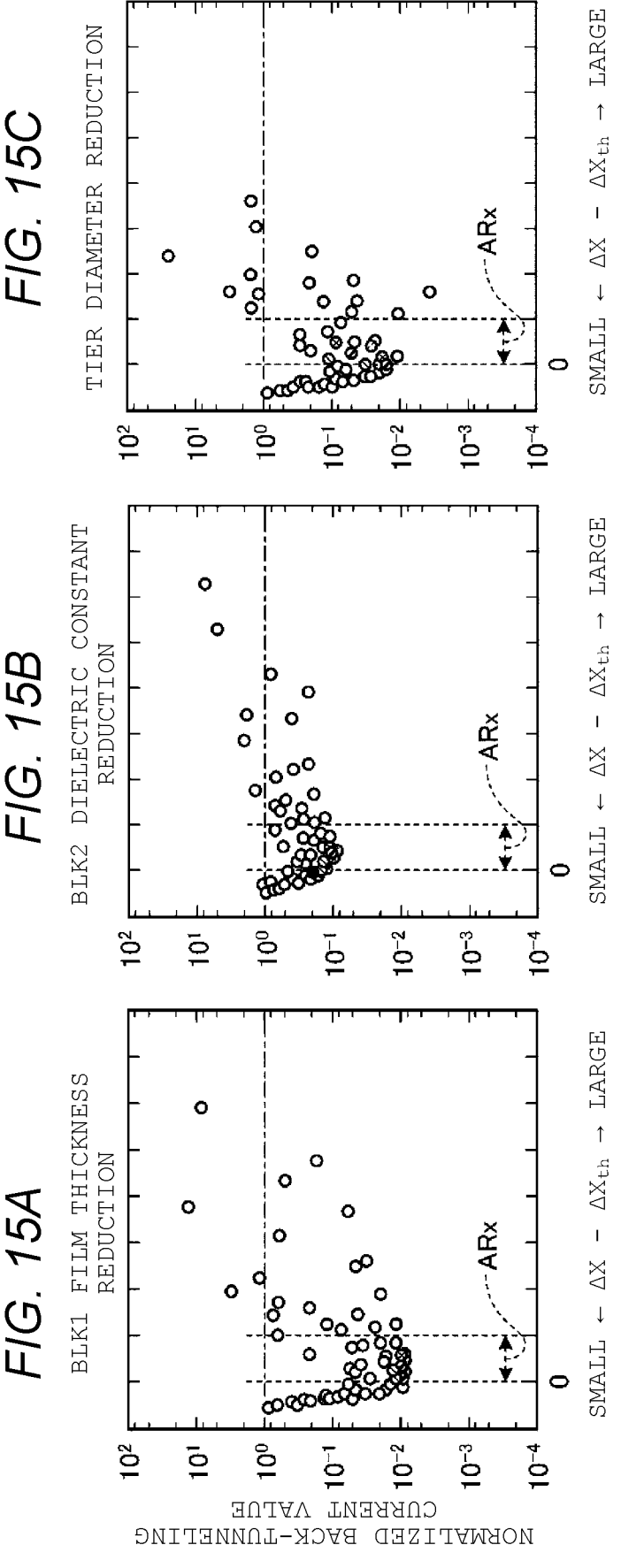
FIGS. 15A to 15C are diagrams illustrating characteristics of a back-tunneling current in the first embodiment when a thickness of an insulating film is reduced, a dielectric constant of an insulating film is reduced, and a diameter of a tier is reduced.

FIGS. 15A to 15C are diagrams illustrating characteristics of the back-tunneling current when a thickness of the insulating film BLK1 is reduced, a dielectric constant of the insulating film BLK2 is reduced, and a diameter of the tier $4a$ is reduced.

For example, FIG. 15A illustrates characteristics of the back-tunneling current when the thickness of the insulating film BLK1 is a thickness (for example, 4 nm) reduced from a standard thickness. It is illustrated that by changing $\Delta x$ while keeping $\Delta z/\Delta x$ at certain values, the back-tunneling current can be reliably reduced to the allowable upper limit value or less in the appropriate range ARx of $\Delta x$.

FIG. 15B illustrates characteristics of the back-tunneling current when the dielectric constant of the insulating film BLK2 is a value (for example, a relative dielectric constant value of 3.9) that is lower than a standard (reference) value. It is illustrated that by changing $\Delta x$ while keeping $\Delta z/\Delta x$ at certain values, the back-tunneling current can be reliably reduced to the allowable upper limit value or less in the appropriate range ARx of $\Delta x$.

FIG. 15C illustrates characteristics of the back-tunneling current when the diameter of the tier $4a$ is a diameter (for example, 90 nm) less than a standard (reference) diameter. It is illustrated that by changing $\Delta x$ while keeping $\Delta z/\Delta x$ at certain values, the back-tunneling current can be reliably reduced to the allowable upper limit value or less in the appropriate range ARx of $\Delta x$.

It is confirmed from FIGS. 15A to 15C that when the thickness of the insulating film BLK1 is reduced, the dielectric constant of the insulating film BLK2 is reduced, or the diameter of the tier $4a$ is reduced, the appropriate range ARx is valid and the back-tunneling current can be reliably reduced to the allowable upper limit value or less.

As illustrated in FIG. 5, in a cross-sectional view in the Z direction including the charge storage film CT, the semiconductor film CH, and the conductive layer 6, the missing amount of the −Z side corner of the conductive layer 6 at the part where the dummy word line DWL2 of the stacked body SST2 faces the charge storage film CT may be larger than the missing amount of the −Z side corner of the conductive layer 6 at the part where the word line WL5 of the stacked body SST2 faces the charge storage film CT. Likewise, in other examples, the missing amount of the −Z side corner at the part where the conductive layer 6 of the dummy word line DWL2 of the stacked body SST2 faces the charge storage film CT may be larger than the missing amount of the −Z side corner at the part where the conductive layer 6 for the word lines WL6, WL7, WL8, and WL9 of the stacked body SST2 faces the charge storage film CT.

For example, in the stacked body SST2, the XY-direction missing amount of the −Z side corner of the conductive layer 6 for the dummy word line DWL2 may be larger than the XY-direction missing amount of the −Z side corner of the conductive layer 6 for the word line WL5. Likewise, the XY-direction missing amount of the −Z side corner of the conductive layer 6 for the dummy word line DWL2 may be larger than the XY-direction missing amount of the −Z side corner of the conductive layer 6 for the word lines WL6, WL7, WL8, and WL9.

Accordingly, it can be ensured that the XY-direction distance between an end portion 6*b*11 of the −Z side surface 6*b* of the conductive layer 6 for the dummy word line DWL2 and the charge storage film CT is larger than the XY-direction distance between the end portion 6*b*11 of the −Z side surface 6*b* of the conductive layer 6 for the word lines WL5, WL6, WL7, WL8, and WL9 and the charge storage film CT. As a result, it is possible to prevent the back-tunneling phenomenon between the dummy word line DWL2 and the charge storage film CT near the joint portion 4*b* in the erasing processing.

Figure 16:
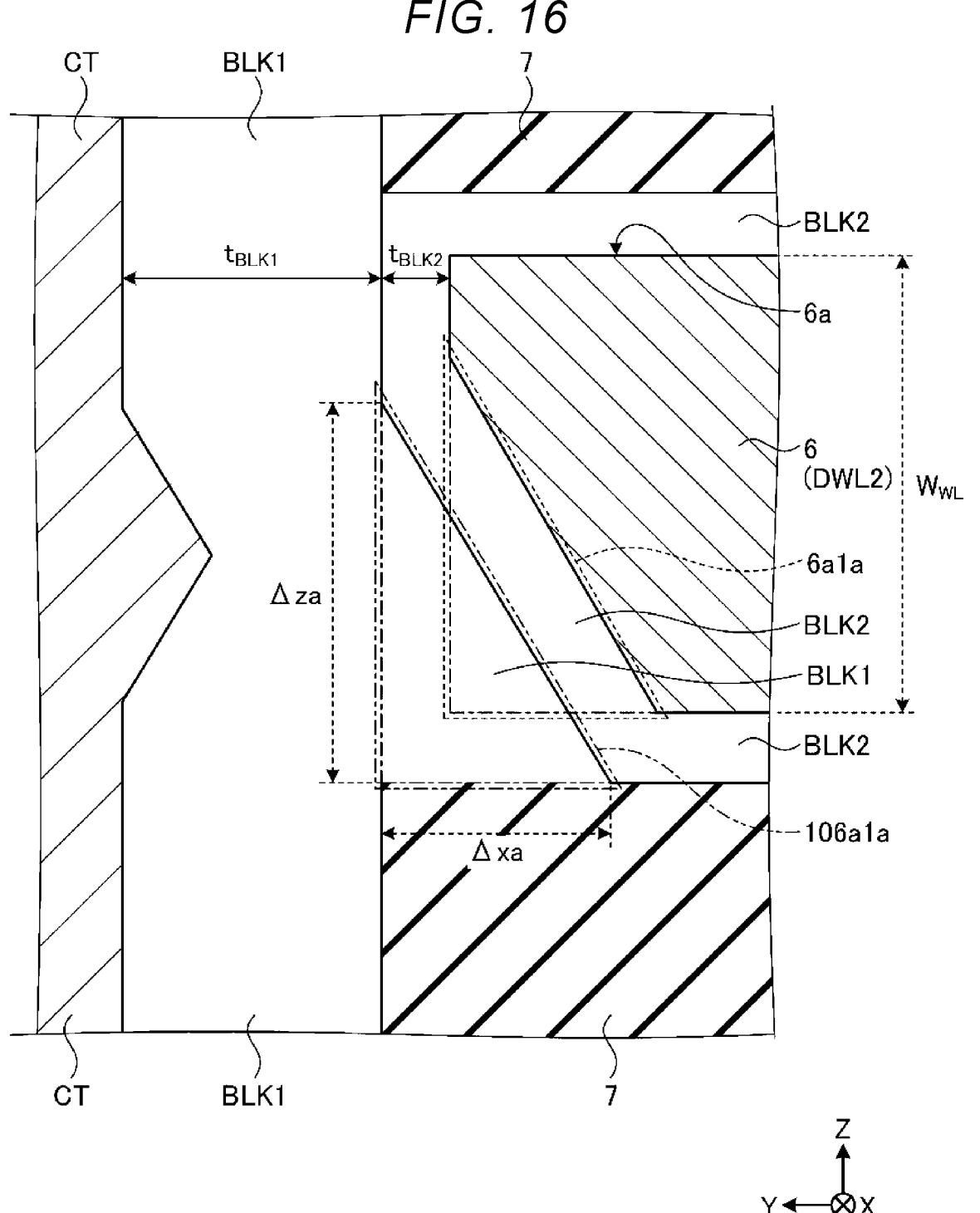
FIG. 16 is a cross-sectional view illustrating parameters for a missing amount of a corner region in the first embodiment.

The missing amount of the −Z side corner in the conductive layer 6 for the dummy word line DWL2 may be defined as illustrated in FIG. 16. FIG. 16 is a cross-sectional view illustrating parameters for describing the missing amount of the corner.

As illustrated in FIG. 16, when the film thickness of the insulating film BLK2 is substantially uniform, a missing portion 106*a*1*a* of the −Z side corner of the insulating film BLK2 formed so as to face the charge storage film CT via the insulating film BLK1 is substantially similar in shape to a missing portion 6*a*1*a* of the −Z side corner of the conductive layer 6. By defining the shape and dimension of the missing portion 106*a*1*a*, the shape and dimension of the missing portion Ga1a can be indirectly defined and the missing amount of the −Z side corner of the conductive layer 6 can be defined. The similitude ratio (similarity ratio) between the missing portion 106*a*1*a* and the missing portion Ga1a is close to 1, and thus the missing portion 106*a*1*a* and the missing portion Ga1a can be regarded as approximately congruent.

In a cross section including the central axis CA1 (see FIG. 5), the XY-direction length of the −Z side end of the missing portion 106*a*1*a* is Δxa. The value Δxa indicates the XY-direction missing amount of the −Z side corner of the conductive layer 6. The Z height of the missing portion 106*a*1*a* is Δza. The value Δza indicates the Z-direction missing amount of the −Z side corner of the conductive layer 6. The Z-direction thickness of the conductive layer 6 is WWL. The XY-direction thickness of the insulating film BLK1 between the end portion of the +Z side surface 6*a* of the conductive layer 6 and the charge storage film CT is tBLK1. The XY-direction thickness of the insulating film BLK2 between the end portion of the +Z side surface 6*a* of the conductive layer 6 and the charge storage film CT is tBLK2.

As a result of examination similar to FIGS. 9A to 10B, the following Expressions 21 and 22 are obtained as appropriate ranges of Δxa and Δza:

$$\Delta x_{th} = \{\sqrt{(1.25)} - 1\}(t_{BLK1} + t_{BLK2}/2.6) < \Delta xa < \Delta za(1 - \Delta za/W_{WL}) \quad \text{(Expression 21)}$$

$$(\Delta za/\Delta xa)\Delta x_{th} = (\Delta za/\Delta xa)\{\sqrt{(1.25)} - 1\}(t_{BLK1} + t_{BLK2}/2.6) < \Delta za < \Delta z_{th} = W_{WL}(1 - \Delta xa/\Delta za) \quad \text{(Expression 22)}$$

Alternatively, the above Expression 18 holds when the XY-direction thickness tBLK2 of the insulating film BLK2 is sufficiently smaller than the XY-direction thickness tBLK1 of the insulating film BLK1 or when the insulating film BLK2 is omitted.

By applying Expression 18 to Expressions 21 and 22, the following Expressions 23 and 24 are obtained as the appropriate ranges of Δxa and Δza:

$$\Delta x_{th} = \{\sqrt{(1.25)} - 1\}t_{BLK1} < \Delta xa < \Delta za(1 - \Delta za/W_{WL}) \quad \text{(Expression 23)}$$

$$(\Delta za/\Delta xa)\Delta x_{th} = (\Delta za/\Delta xa)\{\sqrt{(1.25)} - 1\}t_{BLK1} < \Delta za < \Delta z_{th} = W_{WL}(1 - \Delta xa/\Delta za) \quad \text{(Expression 24)}$$

Next, a method for manufacturing the semiconductor device 1 will be described with reference to FIGS. 17A to 19C. FIGS. 17A to 19C are cross-sectional views illustrating the method for manufacturing the semiconductor device 1.

Figures 17A, 17B, 17C:
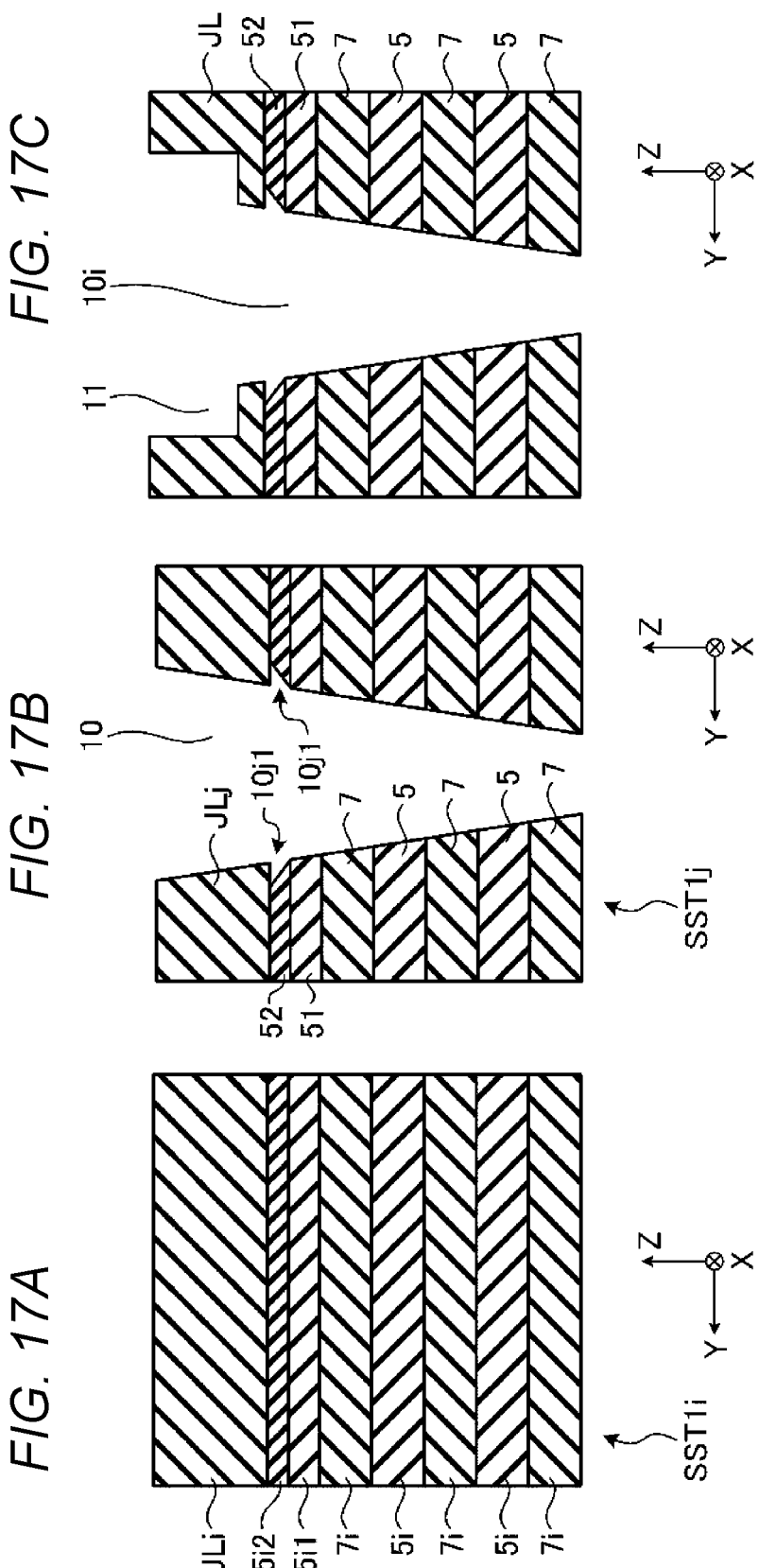
FIGS. 17A to 17C are cross-sectional views illustrating aspects of a method for manufacturing the semiconductor device according to a first embodiment.

In the process illustrated in FIG. 17A, a transistor is formed on the substrate SUB (see FIG. 1), a contact plug, a wiring film, a via plug, and so on are formed on the substrate SUB, and the interlayer insulating film 81 is formed there-around. As a result, the peripheral circuit 100 is formed. The interlayer insulating film 81 can be formed by depositing a material having an insulating material (for example, a semi-conductor oxide such as silicon oxide) as a main component on the +Z side of the substrate SUB (see FIG. 4). The conductive layer 3 is deposited on the +Z side of the interlayer insulating film 81. The conductive layer 3 can be formed of a material having an impurity-containing semi-conductor (for example, silicon) as a main component or a material having a conductive material (for example, a metal such as tungsten) as a main component.

An insulating layer 7*i* and a sacrificial layer 5*i* are alternately deposited a plurality of times on the +Z side of the conductive layer 3, and a sacrificial layer 5*i*1 and a sacrificial layer 5*i*2 are stacked in order on the uppermost insulating layer 7*i* to form a stacked body SST1*i*. The insulating layer 7*i* can be formed of a material having an oxide (for example, silicon oxide) as a main component. The sacrificial layer 5*i* can be formed of a material having a nitride (for example, silicon nitride) as a main component. The sacrificial layer 5*i*1 can be formed of a material having a nitride (for example, silicon nitride) as a main component. The sacrificial layer 5*i*2 can be formed of a material having an oxygen-doped nitride (for example, silicon oxynitride) as a main component. Each insulating layer 7*i* and each sac-rificial layer 5*i* can be deposited with approximately the same film thickness. The sum of the film thickness of the sacrificial layer 5*i*1 and the film thickness of the sacrificial layer 5*i*2 is approximately equal to the film thickness of each sacrificial layer 5*i*. In the stacked body SST1*i*, the most +Z side sacrificial layer 5*i* is stacked with a plurality of layers different in composition (sacrificial layer 5*i*1 and sacrificial layer 5*i*2).

A joint layer JLi is deposited on the +Z side of the stacked body SST1*i*. The joint layer JLi can be formed of a material having an oxide (for example, silicon oxide) as a main component. The joint layer JLi is formed with a film thickness that exceeds the film thickness of the insulating layer 7i and the film thickness of the sacrificial layer 5i.

In the process illustrated in FIG. 17B, a resist pattern in which a memory hole 10 forming position is open is formed on the joint layer JLi. Anisotropic etching such as reactive ion etching (RIE) is performed using the resist pattern as a mask to form the memory hole 10 penetrating a joint layer JLj and a stacked body SST1j and reaching the conductive layer 3.

The etching rate of the sacrificial layer 5i2 exceeds the etching rate of the sacrificial layer 5i1, the etching rate of the insulating layer 7i, and the etching rate of the joint layer JLi with respect to the RIE treatment gas. Therefore, the side surface of the sacrificial layer 5i2 is etched and retracted, and a recess portion 10j1 having a triangular shape in a YZ cross-sectional view is formed on the interface side with the joint layer JLi on the inside surface of the memory hole 10. The recess width (recess amount) of the recess portion 10j1 may be adjusted by the etching time, may be adjusted by the composition of the sacrificial layer 5i2 (for example, the concentration of the oxygen to be doped into the nitride during the film formation of FIG. 17A), or may be adjusted by both.

In the process illustrated in FIG. 17C, a resist pattern in which a joint hole 11 forming position is open is formed on the joint layer JLj. The opening of the resist pattern includes a memory hole 10i inside when viewed from the Z direction. Anisotropic etching such as RIE is performed using the resist pattern as a mask to form the joint hole 11 in the joint layer JL. The joint hole 11 is formed with a diameter larger than the diameter of the memory hole 10i and a depth shallower than the thickness of the joint layer JL. The depth of the joint hole 11 can be adjusted by the etching time of the anisotropic etching.

Figures 18A, 18B, 18C:
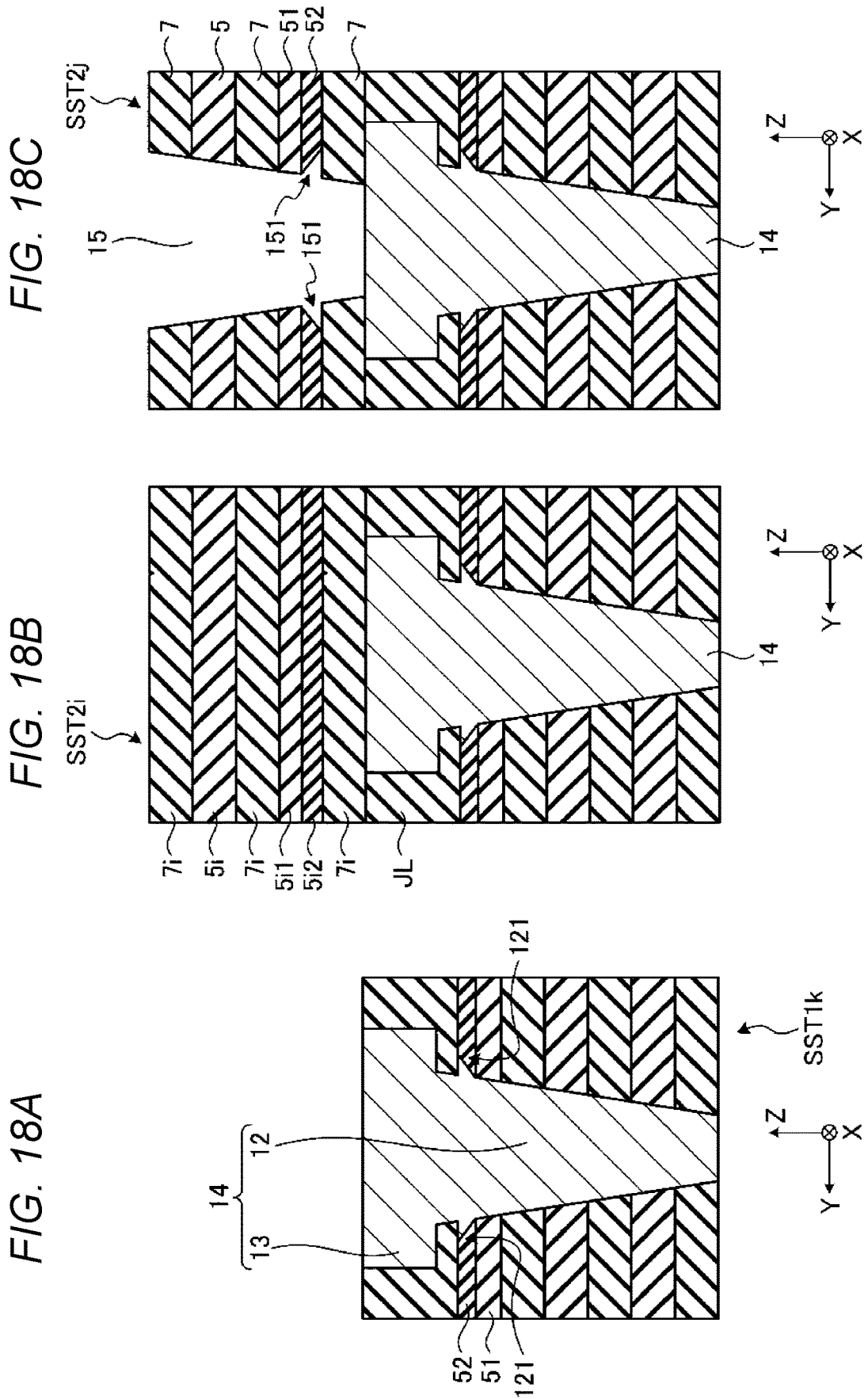
FIGS. 18A to 18C are cross-sectional views illustrating aspects of a method for manufacturing the semiconductor device according to a first embodiment.

In the process illustrated in FIG. 18A, a sacrificial film 14 is embedded in the memory hole 10i and the joint hole 11. The sacrificial film 14 can be formed of a material (for example, amorphous silicon) capable of ensuring an etching selectivity with respect to the insulating layer 7 and sacrificial layers 5, 51, and 52. The sacrificial film 14 includes a columnar portion 12 embedded in the memory hole 10i and a disk-shaped portion 13 embedded in the joint hole 11. The columnar portion 12 has a protrusion portion 121 on the side surface thereof. The protrusion portion 121 abuts in the XY direction against the most +Z side sacrificial layer 52 in a stacked body SST1k.

In the process illustrated in FIG. 18B, the insulating layer 7i, the sacrificial layer 5i2, and the sacrificial layer 5i1 are stacked in order on the +Z side of the joint layer JL and the sacrificial film 14, and the insulating layer 7i and the sacrificial layer 5i are alternately deposited a plurality of times on the sacrificial layer 5i1 to form a stacked body SST2i. The insulating layer 7i can be formed of a material having an oxide (for example, silicon oxide) as a main component. The sacrificial layer 5i2 can be formed of a material having an oxygen-doped nitride (for example, silicon oxynitride) as a main component. The sacrificial layer 5i1 can be formed of a material having a nitride (for example, silicon nitride) as a main component. The sacrificial layer 5i can be formed of a material having a nitride (for example, silicon nitride) as a main component. Each insulating layer 7i and each sacrificial layer 5i can be deposited with a film thickness approximately equal to those of each insulating layer 7i and each sacrificial layer 5i (see FIG. 7A) in the stacked body SST1i. The sum of the film thickness of the sacrificial layer 5i1 and the film thickness of the sacrificial layer 5i2 is approximately equal to the film thickness of each sacrificial layer 5i. In the stacked body SST2i, the most −Z side sacrificial layer 5i is stacked with a plurality of layers different in composition (sacrificial layer 5i2 and sacrificial layer 5i1).

In the process illustrated in FIG. 18C, a resist pattern in which a memory hole 15 forming position is open is formed on the stacked body SST2i. Anisotropic etching such as RIE is performed using the resist pattern as a mask to form the memory hole 15 penetrating a stacked body SST2j and exposing the +Z side surface of the sacrificial film 14.

The etching rate of the sacrificial layer 5i2 exceeds the etching rate of the sacrificial layer 5i1 and the etching rate of the insulating layer 7i with respect to the RIE treatment gas. Therefore, the side surface of the sacrificial layer 5i2 is etched and retracted, and a recess portion 151 having a substantially triangular shape in a YZ cross-sectional view is formed on the interface side with the insulating layer 7i on the inside surface of the memory hole 15. The recess width (recess amount) of the recess portion 151 may be adjusted by the etching time, may be adjusted by the composition of the sacrificial layer 5i2 (for example, the concentration of the oxygen to be doped into the nitride during the film formation of FIG. 18B), or may be adjusted by both.

Figures 19A, 19B, 19C:
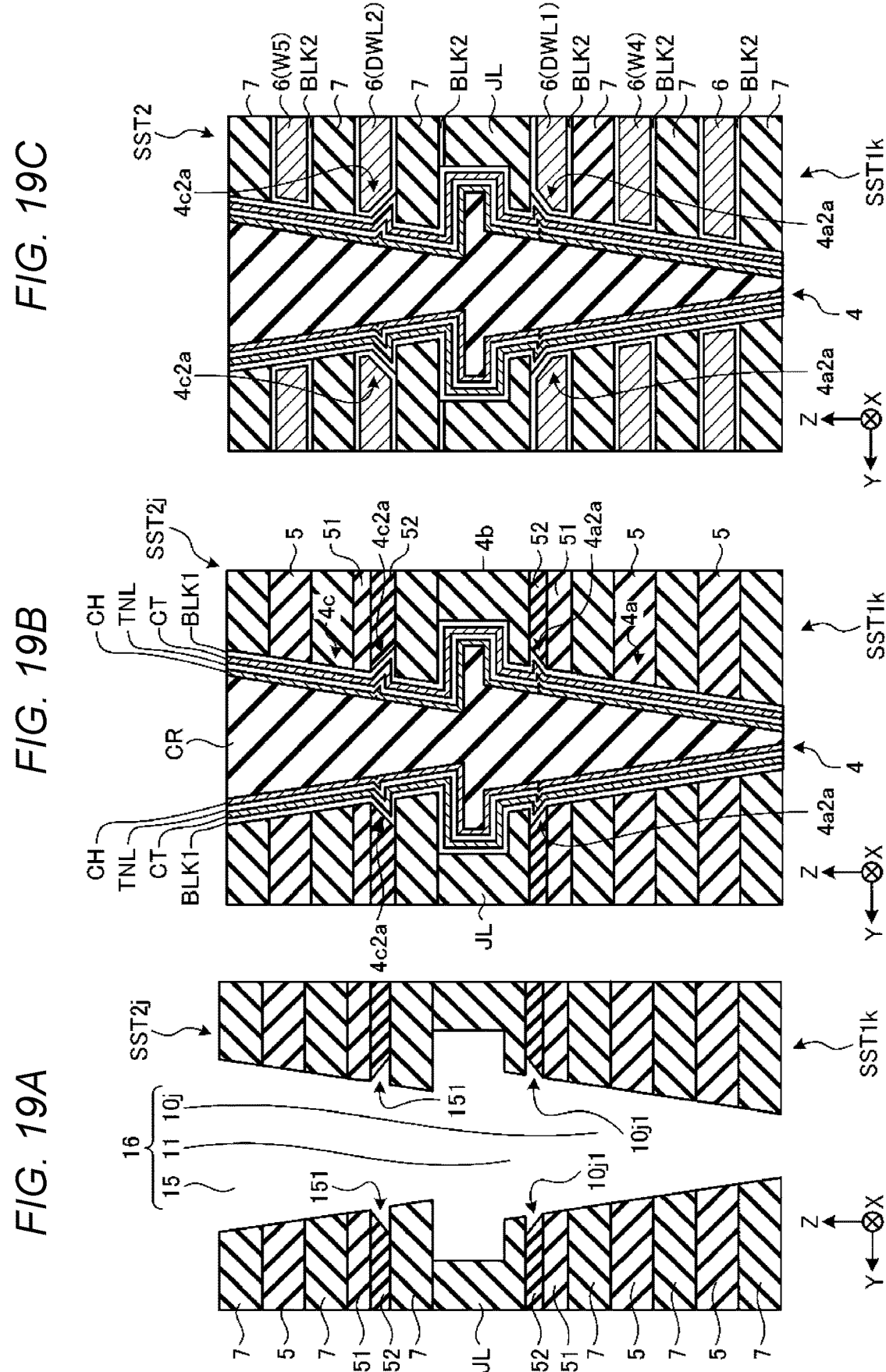
FIGS. 19A to 19C are cross-sectional views illustrating aspects of a method for manufacturing the semiconductor device according to a first embodiment.

In the process illustrated in FIG. 19A, the sacrificial film 14 is removed. As a result, a memory hole 16 is formed that penetrates the stacked body SST2j, the joint layer JL, and the stacked body SST1k and reaches the conductive layer 3 (see FIG. 4). The memory hole 16 includes a memory hole 10j, the joint hole 11, and the memory hole 15 in order on the +Z side of the conductive layer 3. The memory hole 16 has the recess portion 10j1 at the Z position of the sacrificial layer 52 on the −Z side of the joint layer JL and the recess portion 151 at the Z position of the sacrificial layer 52 on the +Z side of the joint layer JL.

In the process illustrated in FIG. 19B, the insulating film BLK1, the charge storage film CT, and the insulating film TNL are deposited in order on the side and bottom surfaces of the memory hole 16. At this time, the insulating film BLK1 can be embedded in the recess portions 10j1 and 151 on the side surface of the memory hole 16. The insulating film BLK1 can be formed of a material having an oxide (for example, silicon oxide, metal oxide, or stack thereof) as a main component. The charge storage film CT can be formed of a material having a nitride (for example, silicon nitride) as a main component. The insulating film TNL can be formed of a material having an oxide (for example, silicon oxide or silicon oxynitride) as a main component. After the part of the bottom surface of the memory hole 16 in the insulating film BLK1, the charge storage film CT, and the insulating film TNL is selectively removed, the semiconductor film CH is deposited on the side and bottom surfaces of the memory hole 16. The semiconductor film CH can be formed of a material having a substantially impurity-free semiconductor (for example, polysilicon) as a main component. Then, the core member CR is embedded in the memory hole 16. The core member CR can be formed of a material having an insulating material (for example, a semiconductor oxide such as silicon oxide) as a main component. As a result, the columnar body 4 penetrating the stacked body SST1k, the joint layer JL, and the stacked body SST2j in the Z direction is formed. The columnar body 4 includes, in order on the +Z side of the conductive layer 3, the tier 4a penetrating the stacked body SST1k in the Z direction, the joint portion 4b substantially penetrating the joint layer JL in the Z direction, and the tier 4c penetrating the stacked body SST2$j$ in the Z direction. The tier 4$a$ has the protrusion portion 4$a$2$a$ on the side surface thereof. The protrusion portion 4$a$2$a$ abuts in the XY direction against the sacrificial layer 52 in the stacked body SST1$k$. The tier 4$c$ has a protrusion portion 4$c$2$a$ on the side surface thereof. The protrusion portion 4$c$2$a$ abuts in the XY direction against the sacrificial layer 52 in the stacked body SST2$j$.

In the process illustrated in FIG. 19C, the sacrificial layers 5, 51, and 52 of the stacked body SST1$k$ and the sacrificial layers 5, 51, and 52 of the stacked body SST2$j$ are removed. The insulating film BLK2 is deposited on the exposed surface of the gap formed by the removal. The insulating film BLK2 can be formed of a material having an insulating material (for example, a metal oxide such as aluminum oxide, zirconium oxide, and hafnium oxide) as a main component. Then, the conductive layer 6 is embedded in the gap. The conductive layer 6 can be formed of a material having a conductive material (for example, a metal such as tungsten) as a main component. As a result, the stacked body SST1 in which the conductive layers 6 and the insulating layers 7 are alternately and repeatedly stacked is formed, and the stacked body SST2 in which the conductive layers 6 and the insulating layers 7 are alternately and repeatedly stacked is formed. The protrusion portion 4$a$2$a$ on the side surface of the tier 4$a$ abuts in the XY direction via the insulating film BLK2 against the most +Z side conductive layer 6 in the stacked body SST1. In other words, a structure is formed in which the XY-direction missing amount of the +Z side corner at the part where the conductive layer 6 for the dummy word line DWL1 faces the charge storage film CT is larger than the XY-direction missing amount of the +Z side corner at the part where the conductive layer 6 for the word line WL4 faces the charge storage film CT. The protrusion portion 4$c$2$a$ on the side surface of the tier 4$c$ abuts in the XY direction via the insulating film BLK2 against the most −Z side (lowermost) conductive layer 6 in the stacked body SST2. In other words, a structure is formed in which the XY-direction missing amount of the −Z side corner at the part where the conductive layer 6 for the dummy word line DWL2 faces the charge storage film CT is larger than the XY-direction missing amount of the −Z side corner at the part where the conductive layer 6 for the word line WL5 faces the charge storage film CT.

For the semiconductor device 1 in the first embodiment, in a cross-sectional view in the Z direction including the charge storage film CT, the semiconductor film CH, and the conductive layer 6, the missing amount of the +Z side corner of the conductive layer 6 for the dummy word line DWL1 is larger than the missing amount of the +Z side corner of the conductive layer 6 for the word line WL4. Accordingly, it can be ensured that the XY-direction distance between the end portion 6$a$11 of the +Z side surface 6$a$ of the conductive layer 6 for the dummy word line DWL1 and the charge storage film CT is larger than the XY-direction distance between the end portion 6$a$11 of the +Z side surface 6$a$ of the conductive layer 6 for the word line WL4 and the charge storage film CT. As a result, it is possible to prevent the back-tunneling phenomenon between the dummy word line DWL1 and the charge storage film CT near the joint portion 4$b$ in the erasing processing.

In the semiconductor device 1, the conductive layer 6 for the dummy word line DWL1 can be configured such that the XY-direction missing amount $\Delta x$ of the +Z side corner satisfies Expression 16 or Expression 19. Alternatively, the conductive layer 6 for the dummy word line DWL1 can be configured such that the Z-direction missing amount $\Delta z$ of the +Z side corner satisfies Expression 17 or Expression 20.

As a result, the back-tunneling current tunneling through the insulating film BLK1 from the dummy word line DWL1 and flowing to the charge storage film CT can be effectively reduced.

In addition, as for the semiconductor device 1 in the first embodiment, in a cross-sectional view in the Z direction including the charge storage film CT, the semiconductor film CH, and the conductive layer 6, the missing amount of the −Z side corner of the conductive layer 6 for the dummy word line DWL2 may be larger than the missing amount of the −Z side corner of the conductive layer 6 for the word line WL5. Accordingly, it can be ensured that the XY-direction distance between the end portion 6$b$11 of the −Z side surface 6$b$ of the conductive layer 6 for the dummy word line DWL2 and the charge storage film CT is larger than the XY-direction distance between the end portion 6$b$11 of the −Z side surface 6$b$ of the conductive layer 6 for the word line WL5 and the charge storage film CT. As a result, it is possible to prevent the back-tunneling phenomenon between the dummy word line DWL2 and the charge storage film CT near the joint portion 4$b$ in the erasing processing.

In the semiconductor device 1, the conductive layer 6 for the dummy word line DWL2 can be configured such that the XY-direction missing amount $\Delta xa$ of the −Z side corner satisfies Expression 21 or Expression 23. Alternatively, the conductive layer 6 for the dummy word line DWL2 can be configured such that the Z-direction missing amount $\Delta za$ of the −Z side corner satisfies Expression 22 or Expression 24. As a result, the back-tunneling current tunneling through the insulating film BLK1 from the dummy word line DWL2 and flowing to the charge storage film CT can be effectively reduced.

Second Embodiment

Next, a semiconductor device according to a second embodiment will be described. The following description will focus on differences from the first embodiment.

While the first embodiment illustrates a configuration in which the outside surface of the insulating film BLK1 in the tier has a protrusion portion and the inside surface has a recess portion at the position corresponding to the corner of a conductive layer of a dummy word line, the second embodiment illustrates a configuration in which an outside surface of the insulating film BLK1 has a protrusion portion but an inside surface is substantially flat.

Figure 20:
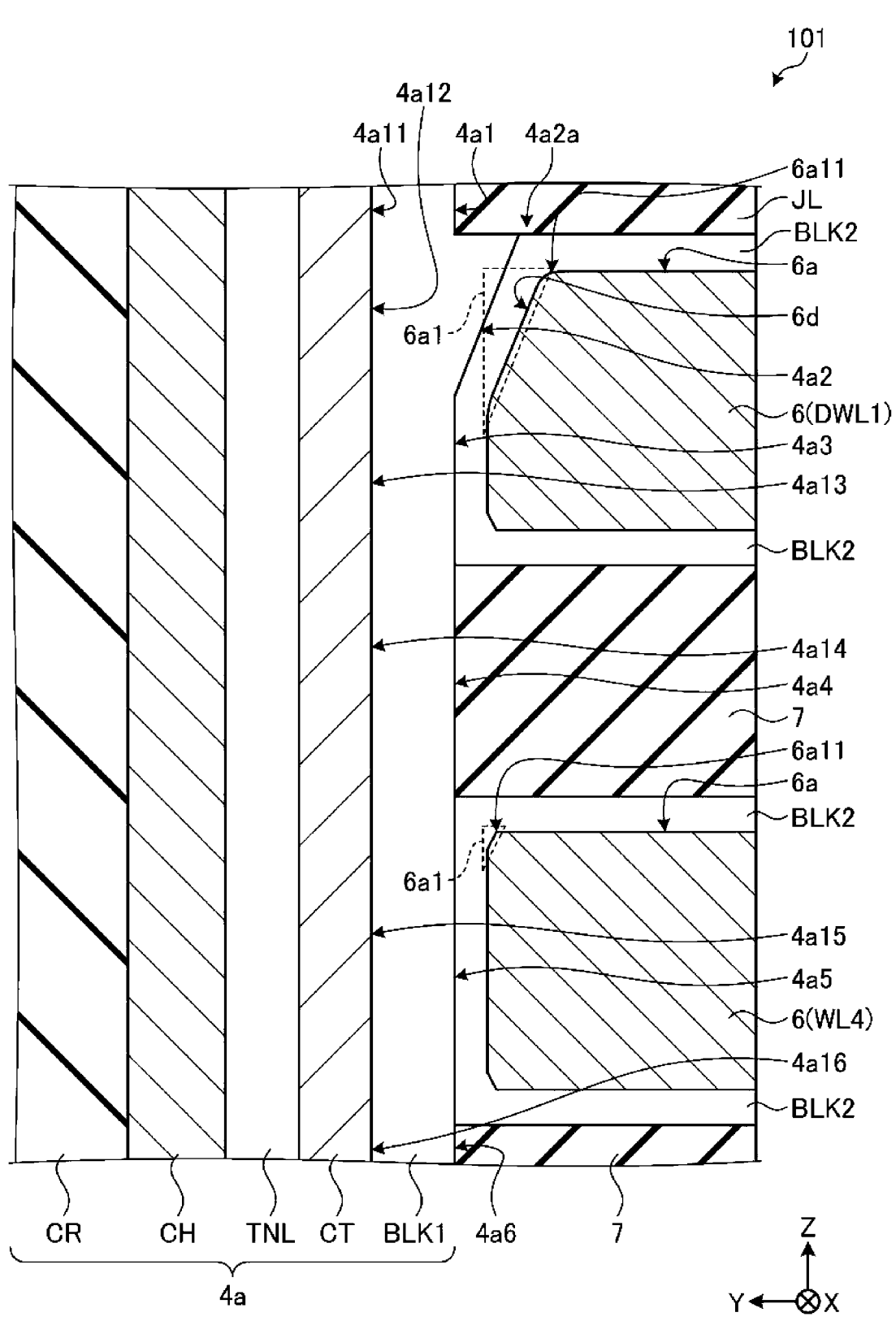
FIG. 20 is a cross-sectional view illustrating a missing portion of an upper corner of a conductive layer in a second embodiment.

As illustrated in FIG. 20, in a semiconductor device 101 according to the second embodiment, the vicinity of the portion of the conductive layer 6 for the dummy word line DWL1 facing the charge storage film CT is configured to have a missing portion at a corner. FIG. 20 is an enlarged cross-sectional view illustrating a configuration of a missing portion of the +Z side (upper) corner of the conductive layer 6 for the dummy word line DWL1 and corresponds in general to a cross-sectional view in which the region B of FIG. 5 is illustrated in an enlarged manner.

For example, at the Z position corresponding to the +Z side corner at the part where the conductive layer 6 for the dummy word line DWL1 faces the charge storage film CT, a side surface of the charge storage film CT in the tier 4$a$ is flat and the protrusion portion 4$a$2$a$ is disposed on a side surface of the insulating film BLK1. In other words, at the Z position corresponding to the +Z side corner of the conductive layer 6 for the dummy word line DWL1, the inside surface of the insulating film BLK1 is substantially flat, the protrusion portion 4$a$2$a$ causes the outside surface of the insulating film BLK1 to protrude to the outside, and an XY-direction film thickness of the insulating film BLK1 is partially increased. As a result, the +Z side surface 6d of the conductive layer 6 is retracted to the outside of the tier 4a.

The outer peripheral surfaces 4a1, 4a3, 4a4, and 4a5 form the first reference outer peripheral surface, which is an integral (continuous) surface. The outer peripheral surface 4a2 is positioned outside the first reference outer peripheral surface. The outer peripheral surfaces 4a11, 4a13, 4a14, and 4a15 form the second reference outer peripheral surface which is an integral surface. The outer peripheral surface 4a12 is positioned substantially in the second reference outer peripheral surface. At the Z position corresponding to the +Z side corner of the conductive layer 6 for the dummy word line DWL1, the XY-direction film thickness of the insulating film BLK1 is partially increased, and the +Z side corner of the conductive layer 6 of the dummy word line DWL1 is missing to a position retracted further outward from the first reference outer peripheral surface as compared with the +Z side corner of the word line WL4 on the central axis CA1 side.

Accordingly, at the +Z side corner of the conductive layer 6 for the dummy word line DWL1, the missing portion 6a1 having a substantially right-angled triangular shape in a YZ cross-sectional view is formed with a relatively large dimension. At the +Z side corner of the conductive layer 6 for the word line WL4, the missing portion 6a1 is not substantially formed or the missing portion 6a1 having a substantially right-angled triangular shape in a YZ cross-sectional view is formed with a relatively small dimension.

In other words, the missing amount of the +Z side corner of the conductive layer 6 for the dummy word line DWL1 of the stacked body SST1 is larger than the missing amount of the +Z side corner of the conductive layer 6 for the word line WL4 of the stacked body SST1. Likewise, the missing amount of the +Z side corner of the conductive layer 6 for the dummy word line DWL1 is larger than the missing amount of the +Z side corner of the conductive layer 6 for the word lines WL3, WL2, WL1, and WL0 of the stacked body SST1.

Accordingly, it can be ensured that the XY-direction distance between the end portion 6a11 of the +Z side surface 6a of the conductive layer 6 for the dummy word line DWL1 and the charge storage film CT is larger than the XY-direction distance between the end portion 6a11 of the +Z side surface 6a of the conductive layer 6 for the word lines WL4, WL3, WL2, WL1, and WL0 and the charge storage film CT. As a result, it is possible to further prevent the back-tunneling phenomenon between the dummy word line DWL1 and the charge storage film CT near the joint portion 4b (see FIG. 5) in the erasing processing.

Likewise, although not specifically illustrated, at the Z position corresponding to the −Z side corner at the part where the conductive layer 6 for the dummy word line DWL2 faces the charge storage film CT, the side surface of the charge storage film CT in the tier 4c can be flat and the protrusion portion 4c2a disposed on the side surface of the insulating film BLK1. In other words, at the Z position corresponding to the −Z side corner of the conductive layer 6 for the dummy word line DWL2, the inside surface of the insulating film BLK1 is flat, and the protrusion portion 4c2a causes the outside surface of the insulating film BLK1 to protrude to the outside.

Accordingly, at the −Z side corner of the conductive layer 6 for the dummy word line DWL2, the missing portion Gala having a substantially right-angled triangular shape in a YZ cross-sectional view is formed with a relatively large dimension. At the −Z side corner at the part where the conductive layer 6 for the word line WL5 faces the charge storage film CT, the missing portion Gala is not substantially formed or the missing portion Gala having a substantially right-angled triangular shape in a YZ cross-sectional view is formed with a relatively small dimension.

In other words, the missing amount of the −Z side corner of the conductive layer 6 for the dummy word line DWL2 of the stacked body SST2 is larger than the missing amount of the −Z side corner of the conductive layer 6 for the word line WL5 of the stacked body SST2. Likewise, the missing amount of the −Z side corner of the conductive layer 6 for the dummy word line DWL2 can be larger than the missing amount of the −Z side corner of the conductive layer 6 for the word lines WL6, WL7, WL8, and WL9 of the stacked body SST2.

Accordingly, it can be ensured that the XY-direction distance between the end portion 6b11 of the −Z side surface 6b of the conductive layer 6 for the dummy word line DWL2 and the charge storage film CT is larger than the XY-direction distance between the end portion 6b11 of the −Z side surface 6b of the conductive layer 6 for the word line WL5 and the charge storage film CT. As a result, it is possible to further prevent the back-tunneling phenomenon between the dummy word line DWL2 and the charge storage film CT near the joint portion 4b (see FIG. 5) in the erasing processing.

Figure 21:
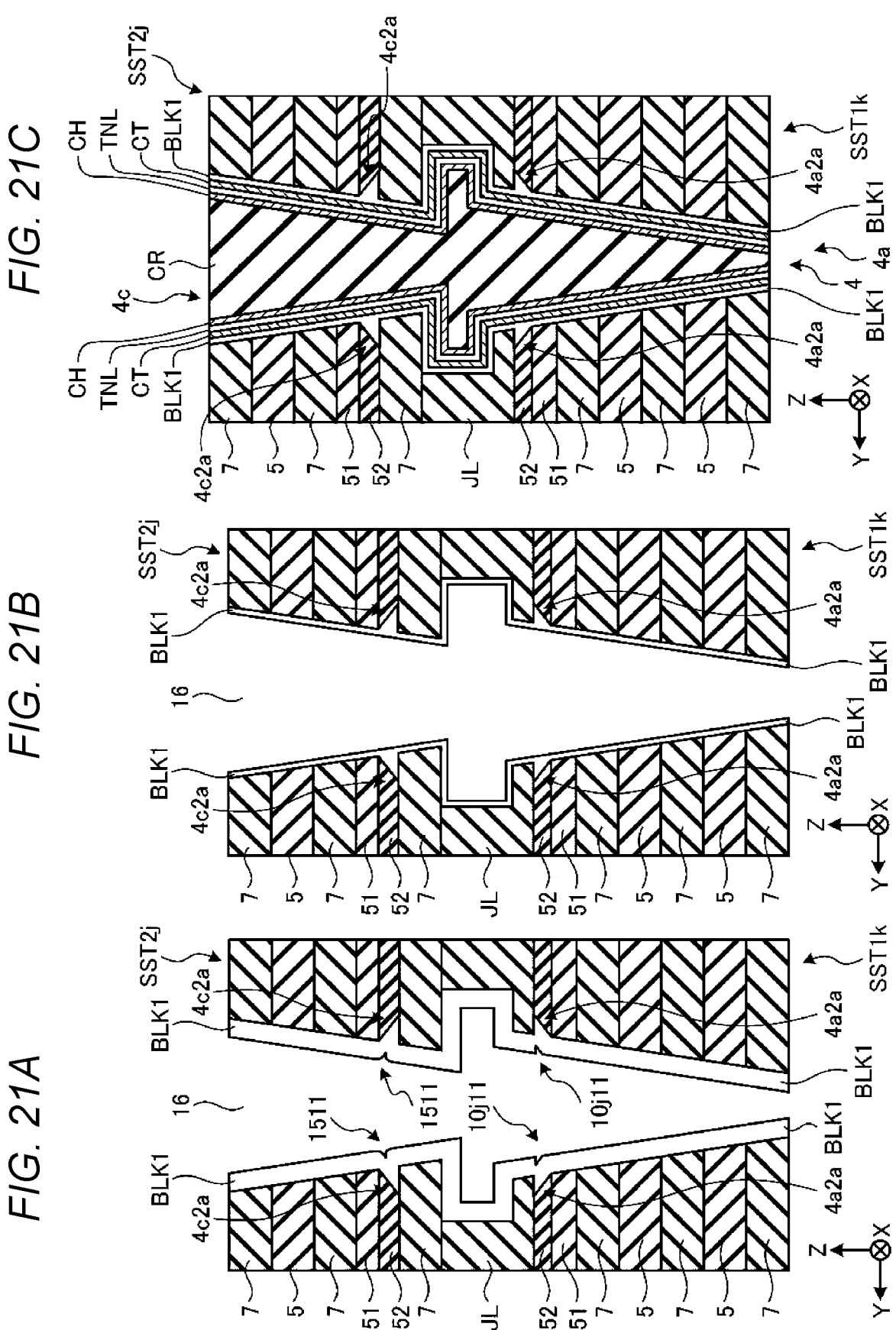
FIGS. 21A to 21C are cross-sectional views illustrating aspects of a method for manufacturing the semiconductor device according to a second embodiment.

As illustrated in FIGS. 21A to 21C, a method for manufacturing the semiconductor device 101 differs from that of the first embodiment in the following points. FIGS. 21A to 21C are cross-sectional views illustrating aspects of the method for manufacturing the semiconductor device 101.

The process illustrated in FIG. 21A is performed after the processes illustrated in FIGS. 17A to 19A have been performed. In the process illustrated in FIG. 21A, the insulating film BLK1 is deposited on the side and bottom surfaces of the memory hole 16. At this time, the insulating film BLK1 can be embedded in the recess portions 10j1 and 151 (see FIG. 19A) of the side surface of the memory hole 16. The insulating film BLK1 can be formed of a material having an oxide (for example, silicon oxide, metal oxide, or stack thereof) as a main component. The insulating film BLK1 is deposited such that the XY-direction thickness thereof exceeds a desired XY-direction thickness (see FIG. 19B). At this time, on the outside surface of the insulating film BLK1, the protrusion portion 4a2a is formed at the Z position of the sacrificial layer 52 on the −Z side of the joint layer JL and the protrusion portion 4c2a is formed at the Z position of the sacrificial layer 52 on the +Z side of the joint layer JL. On the inside surface of the insulating film BLK1, a recess portion 10j11 is formed at the Z position of the sacrificial layer 52 on the −Z side of the joint layer JL and a recess portion 1511 is formed at the Z position of the sacrificial layer 52 on the +Z side of the joint layer JL.

In the process illustrated in FIG. 21B, the insulating film BLK1 on the side and bottom surfaces of the memory hole 16 is etched back and slimmed (trimmed) by anisotropic etching such as RIE. The slimming treatment time is controlled such that the XY-direction thickness of the insulating film BLK1 at the Z position other than the protrusion portions 4a2a and 4c2a is equal to a desired XY-direction thickness (see FIG. 19B). As a result, on the inside surface of the insulating film BLK1, the part of the Z position of the sacrificial layer 52 on the −Z side of the joint layer JL is flattened and the part of the Z position of the sacrificial layer 52 on the +Z side of the joint layer JL is flattened.

In the process illustrated in FIG. 21C, the charge storage film CT and the insulating film TNL are deposited in order on the side and bottom surfaces of the memory hole 16. After the part of the bottom surface of the memory hole 16 in the insulating film BLK1, the charge storage film CT, and the insulating film TNL is selectively removed, the semiconductor film CH is deposited on the side and bottom surfaces of the memory hole 16. Then, the core member CR is embedded in the memory hole 16. As a result, the columnar body 4 penetrating the stacked body SST1*k*, the joint layer JL, and the stacked body SST2*j* in the Z direction is formed. The columnar body 4 includes, in order on the +Z side of the conductive layer 3, the tier 4*a* penetrating the stacked body SST1*k* in the Z direction, the joint portion 4*b* substantially penetrating the joint layer JL in the Z direction, and the tier 4*c* penetrating the stacked body SST2*j* in the Z direction.

In the tier 4*a*, the inside surface of the insulating film BLK1 is flat and protrusion portion-less whereas the outside surface of the insulating film BLK1 has the protrusion portion 4*a*2*a*. The protrusion portion 4*a*2*a* abuts in the XY direction against the sacrificial layer 52 in the stacked body SST1*k*. In the tier 4*c*, the inside surface of the insulating film BLK1 is flat and protrusion portion-less whereas the outside surface of the insulating film BLK1 has the protrusion portion 4*c*2*a*. The protrusion portion 4*c*2*a* abuts in the XY direction against the sacrificial layer 52 in the stacked body SST2*j*.

The same process as in FIG. 19C is performed thereafter.

In the semiconductor device 101 in the second embodiment, the insulating film BLK1 between the conductive layer 6 for the dummy word line DWL1 and the charge storage film CT has an outside surface having a protrusion portion 4*a*2*a* protruding to the conductive layer 6 side but has a substantially flat inside surface. As a result, it can be ensured that the XY-direction distance between the end portion 6*a*11 of the +Z side surface 6*a* of the conductive layer 6 for the dummy word line DWL1 and the charge storage film CT is larger than the XY-direction distance between the end portion 6*a*11 of the +Z side surface 6*a* of the conductive layer 6 for the word line WL4 and the charge storage film CT. Therefore, it is possible to further prevent the back-tunneling phenomenon between the dummy word line DWL1 and the charge storage film CT near the joint portion 4*b* in the erasing processing.

In addition, in the semiconductor device 101, the insulating film BLK1 between the conductive layer 6 for the dummy word line DWL2 and the charge storage film CT has an outside surface having a protrusion portion 4*c*2*a* protruding to the conductive layer 6 side but has a substantially flat inside surface. As a result, it can be ensured that the XY-direction distance between the end portion 6*b*11 of the −Z side surface 6*b* of the conductive layer 6 for the dummy word line DWL2 and the charge storage film CT is larger than the XY-direction distance between the end portion 6*b*11 of the −Z side surface 6*b* of the conductive layer 6 for the word line WL5 and the charge storage film CT. Therefore, it is possible to further prevent the back-tunneling phenomenon between the dummy word line DWL2 and the charge storage film CT near the joint portion 4*b* in the erasing processing.

Third Embodiment

Next, a semiconductor device according to a third embodiment will be described. The following description will focus on differences from the first and second embodiments.

While the first and second embodiments illustrate a configuration in which a protrusion portion is disposed on the side surface of the tier at the position corresponding to a conductive layer for a dummy word line, the third embodiment illustrates a configuration in which an insulating film is added between a conductive layer for the dummy word line and a tier.

Figure 22:
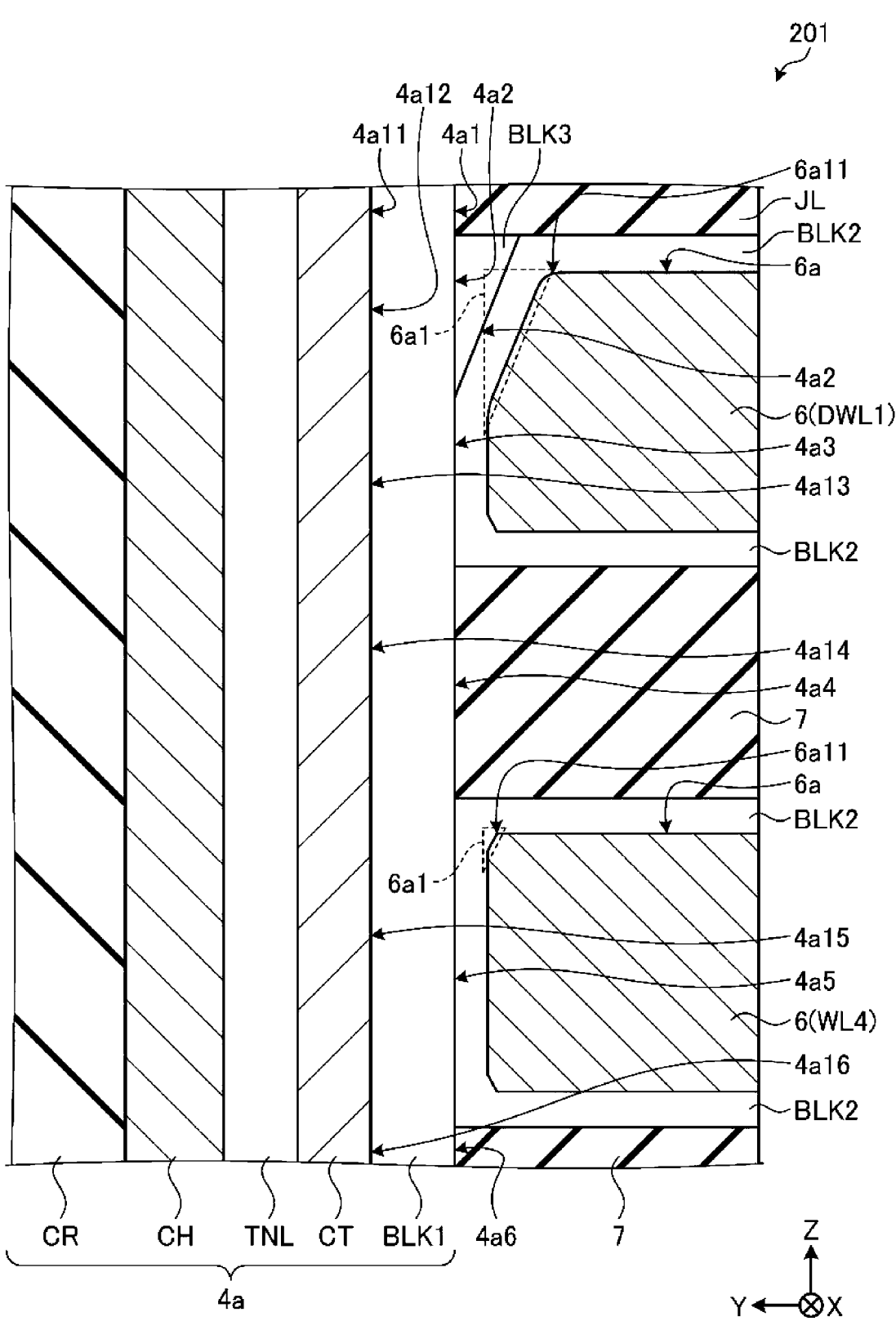
FIG. 22 is a cross-sectional view illustrating a missing portion of an upper corner of a conductive layer in a third embodiment.

As illustrated in FIG. 22, in a semiconductor device 201 according to the third embodiment, the vicinity of the portion of the conductive layer 6 for the dummy word line DWL1 facing the charge storage film CT has a missing portion at a corner. FIG. 22 is an enlarged cross-sectional view illustrating a configuration of a missing portion of the +Z side (upper) corner of the conductive layer 6 for the dummy word line DWL1 and corresponds to a cross-sectional view in which the region B of FIG. 5 is illustrated in an enlarged manner.

An insulating film BLK3 is added between the conductive layer 6 for the dummy word line DWL1 and the tier 4*a*. As for the insulating film BLK3, a surface on a side far from the charge storage film CT faces the conductive layer 6 via the insulating film BLK2, and a surface on a side close to the charge storage film CT abuts against the outer peripheral surface 4*a*2 of the tier 4*a*. In other words, the insulating film BLK3 in addition to the insulating film BLK2 is further interposed between the conductive layer 6 for the dummy word line DWL1 and the tier 4*a* whereas the insulating film BLK2 alone is interposed between the conductive layer 6 for the word line WL4 and the tier 4*a*. In addition, the +Z side corner at the part where the conductive layer 6 for the dummy word line DWL1 faces the charge storage film CT is missing up to a position retracted further outward from the first reference outer peripheral surface as compared with the +Z side corner of the word line WL4 on the central axis CA1 side.

Accordingly, at the +Z side corner of the conductive layer 6 for the dummy word line DWL1, missing portion 6*a*1 having a substantially right-angled triangular shape in a YZ cross-sectional view is formed with a relatively large dimension. At the +Z side corner of the conductive layer 6 for the word line WL4, the missing portion 6*a*1 is not substantially formed or the missing portion 6*a*1 having a substantially right-angled triangular shape in a YZ cross-sectional view is formed with a relatively small dimension.

In other words, the missing amount of the +Z side corner of the conductive layer for the dummy word line DWL1 of the stacked body SST1 is larger than the missing amount of the +Z side corner of the conductive layer 6 for the word line WL4 of the stacked body SST1. Likewise, the missing amount of the +Z side corner of the conductive layer 6 for the dummy word line DWL1 is larger than the missing amount of the +Z side corner of the conductive layer 6 for the word lines WL3, WL2, WL1, and WL0 of the stacked body SST1.

Accordingly, it can be ensured that the XY-direction distance between the end portion 6*a*11 of the +Z side surface 6*a* of the conductive layer 6 for the dummy word line DWL1 and the charge storage film CT is larger than the XY-direction distance between the end portion 6*a*11 of the +Z side surface 6*a* of the conductive layer 6 for the word lines WL4, WL3, WL2, WL1, and WL0 and the charge storage film CT. As a result, it is possible to prevent the back-tunneling phenomenon between the dummy word line DWL1 and the charge storage film CT near the joint portion 4*b* (see FIG. 5) in the erasing processing.

The insulating film BLK3 interposed between the conductive layer 6 for the dummy word line DWL1 and the tier 4a may differ in composition from the insulating film BLK1 (for example, silicon oxide) or may differ in composition from the insulating film BLK2 (for example, a metal oxide such as aluminum oxide, zirconium oxide, and hafnium oxide). The insulating film BLK3 may be formed of a material lower in dielectric constant than the insulating film BLK1. The insulating film BLK3 may be formed of, for example, a silicon oxide containing one or more elements selected from a group consisting of carbon, fluorine, nitrogen, hydrogen, and boron or may be formed of a material obtained by reducing the density of a silicon oxide or making a silicon oxide porous. As a result, with the insulating film BLK3, it is possible to ensure that an electrical film thickness in a case of conversion into a silicon oxide film is larger than a physical film thickness, and thus the back-tunneling phenomenon can be effectively prevented.

The outer peripheral surfaces 4a1, 4a3, 4a4, and 4a5 together form the first reference outer peripheral surface, which is an integral (continuous) surface. The outer peripheral surface 4a2 is positioned substantially in the first reference outer peripheral surface. The outer peripheral surfaces 4a11, 4a13, 4a14, and 4a15 form the second reference outer peripheral surface which is an integral surface. The outer peripheral surface 4a12 is positioned substantially in the second reference outer peripheral surface. The insulating film BLK3 is interposed between an inclined surface on the +Z side of the insulating film BLK2 faced the charge storage film CT via the insulating film BLK1 and the outer peripheral surface 4a12 (outer peripheral surface 4a2). When viewed from the charge storage film CT, the inclined surface has an XY position directed to the outside toward the Z position on the +Z side. Accordingly, the insulating film BLK3 has an XY-direction film thickness increasing toward the Z position on the +Z side.

Likewise, although not specifically illustrated, the insulating film BLK3 can be added between the conductive layer 6 for the dummy word line DWL2 and the tier 4c. As for the insulating film BLK3, the surface on the side far from the charge storage film CT faces the conductive layer 6 via the insulating film BLK2, and the surface on the side close to the charge storage film CT abuts against the outer peripheral surface of the tier 4c. The insulating film BLK3 in addition to the insulating film BLK2 is further interposed between the conductive layer 6 for the dummy word line DWL2 and the tier 4c whereas the insulating film BLK2 alone is interposed between the conductive layer 6 for the word line WL5 and the tier 4c.

Accordingly, at the −Z side corner of the conductive layer 6 for the dummy word line DWL2, missing portion Ga1a having a substantially right-angled triangular shape in a YZ cross-sectional view is formed with a relatively large dimension. At the −Z side corner at the part where the conductive layer 6 for the word line WL5 faces the charge storage film CT, the missing portion Ga1a is not substantially formed or a missing portion 6a1a having a substantially right-angled triangular shape in a YZ cross-sectional view is formed with a relatively small dimension.

In other words, the missing amount of the −Z side corner of the conductive layer 6 for the dummy word line DWL2 of the stacked body SST2 is larger than the missing amount of the −Z side corner of the conductive layer 6 for the word line WL5 of the stacked body SST2. Likewise, the missing amount of the −Z side corner of the conductive layer 6 for the dummy word line DWL2 of the stacked body SST2 is larger than the missing amount of the −Z side corner of the conductive layers 6 for the word lines WL6, WL7, WL8, and WL9 of the stacked body SST2.

Accordingly, it can be ensured that the XY-direction distance between the end portion 6b11 of the −Z side surface 6b of the conductive layer 6 for the dummy word line DWL2 and the charge storage film CT is larger than the XY-direction distance between the end portion 6b11 of the −Z side surface 6b of the conductive layer 6 for the word lines WL5, WL6, WL7, WL8, and WL9 and the charge storage film CT. As a result, it is possible to prevent the back-tunneling phenomenon between the dummy word line DWL2 and the charge storage film CT near the joint portion 4b (see FIG. 5) in the erasing processing.

The insulating film BLK3 interposed between the conductive layer 6 for the dummy word line DWL2 and the tier 4c may differ in composition from the insulating film BLK1 (for example, silicon oxide) or may differ in composition from the insulating film BLK2 (for example, a metal oxide such as aluminum oxide, zirconium oxide, and hafnium oxide). The insulating film BLK3 may be formed of a material lower in dielectric constant than the insulating film BLK1. The insulating film BLK3 may be formed of, for example, a silicon oxide containing one or more elements selected from the group consisting of carbon, fluorine, nitrogen, hydrogen, and boron or may be formed of a material obtained by reducing the density of a silicon oxide or making a silicon oxide porous. As a result, with the insulating film BLK3, it is possible to ensure that the electrical film thickness in the case of conversion into a silicon oxide film is larger than the physical film thickness, and thus the back-tunneling phenomenon can be effectively prevented.

In addition, as illustrated in FIGS. 23A to 23C, a method for manufacturing the semiconductor device 201 differs from that of the first embodiment in the following points. FIGS. 23A to 23C are cross-sectional views illustrating the method for manufacturing the semiconductor device 201.

The process illustrated in FIG. 23A is performed after the processes illustrated in FIGS. 17A to 19A are performed. In the process illustrated in FIG. 23A, the insulating film BLK3 is deposited on the side and bottom surfaces of the memory hole 16. At this time, the insulating film BLK3 can be embedded in the recess portions 10j1 and 151 (see FIG. 19A) of the side surface of the memory hole 16. The insulating film BLK3 can be formed of a material having an insulating material as a main component. The insulating film BLK3 may be formed of a material having an insulating material lower in dielectric constant than the insulating film BLK1 as a main component.

In the process illustrated in FIG. 23B, the insulating film BLK3 on the side and bottom surfaces of the memory hole 16 is etched back and removed by anisotropic etching such as RIE. As a result, the insulating film BLK3 embedded in the recess portions 10j1 and 151 of the side surface of the memory hole 16 is left.

In the process illustrated in FIG. 23C, the insulating film BLK1, the charge storage film CT and the insulating film TNL are deposited in order on the side and bottom surfaces of the memory hole 16. After the part of the bottom surface of the memory hole 16 in the insulating film BLK1, the charge storage film CT, and the insulating film TNL is selectively removed, the semiconductor film CH is deposited on the side and bottom surfaces of the memory hole 16. Then, the core member CR is embedded in the memory hole 16. As a result, the columnar body 4 penetrating the stacked body SST1k, the joint layer JL, and the stacked body SST2j in the Z direction is formed. The columnar body 4 includes, in order on the +Z side of the conductive layer 3, the tier 4a penetrating the stacked body SST1k in the Z direction, the joint portion 4b substantially penetrating the joint layer JL in the Z direction, and the tier 4c penetrating the stacked body SST2*j* in the Z direction.

In the tier 4a, the insulating film BLK3 is interposed between the insulating film BLK1 and the sacrificial layer 52. In the tier 4c, the insulating film BLK3 is interposed between the insulating film BLK1 and the sacrificial layer 52.

The same process as in FIG. 19C is performed thereafter.

In the semiconductor device 201 of the third embodiment, the insulating film BLK3 is added between the conductive layer 6 for the dummy word line DWL1 and the tier 4a. As a result, it can be ensured that the XY-direction distance between the end portion 6a11 of the +Z side surface 6a of the conductive layer 6 for the dummy word line DWL1 and the charge storage film CT is larger than the XY-direction distance between the end portion 6a11 of the +Z side surface 6a of the conductive layer 6 for the word line WL4 and the charge storage film CT. Therefore, it is possible to further prevent the back-tunneling phenomenon between the dummy word line DWL1 and the charge storage film CT near the joint portion 4b in the erasing processing.

In addition, in the semiconductor device 201 of the third embodiment, the insulating film BLK3 can be formed of a material having an insulating material lower in dielectric constant than the insulating film BLK1. As a result, it can be ensured that the electrical XY-direction distance between the end portion 6a11 of the +Z side surface 6a of the conductive layer 6 for the dummy word line DWL1 and the charge storage film CT is larger than the electrical XY-direction distance between the end portion 6a11 of the +Z side surface 6a of the conductive layer 6 for the word line WL4 and the charge storage film CT. Therefore, it is possible to further prevent the back-tunneling phenomenon between the dummy word line DWL1 and the charge storage film CT near the joint portion 4b in the erasing processing.

In addition, in the semiconductor device 201 of the third embodiment, the insulating film BLK3 is added between the conductive layer 6 for the dummy word line DWL2 and the tier 4c. As a result, it can be ensured that the XY-direction distance between the end portion 6b11 of the –Z side surface 6b of the conductive layer 6 for the dummy word line DWL2 and the charge storage film CT is larger than the XY-direction distance between the end portion 6b11 of the –Z side surface 6b of the conductive layer 6 for the word line WL5 and the charge storage film CT. Therefore, it is possible to further prevent the back-tunneling phenomenon between the dummy word line DWL2 and the charge storage film CT near the joint portion 4b in the erasing processing.

In the semiconductor device 201 of the third embodiment, the insulating film BLK3 interposed between the conductive layer 6 for the dummy word line DWL2 and the tier 4c can be formed of a material having an insulating material lower in dielectric constant than the insulating film BLK1. As a result, it can be ensured that the effective electrical XY-direction distance between the end portion 6b11 of the –Z side surface 6b of the conductive layer 6 for the dummy word line DWL2 and the charge storage film CT is larger than the effective electrical XY-direction distance between the end portion 6b11 of the –Z side surface 6b of the conductive layer 6 for the word line WL5 and the charge storage film CT. Therefore, it is possible to further prevent the back-tunneling phenomenon between the dummy word line DWL2 and the charge storage film CT near the joint portion 4b in the erasing processing.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device, comprising:
a first stacked body in which a first plurality of conductive layers are stacked one on the other via an insulating layer;
a second stacked body above the first stacked body in a stacking direction, the second stacked body having a second plurality of conductive layers stacked one on the other via an insulating layer;
a semiconductor film passing through the first stacked body and the second stacked body in the stacking direction; and
a charge storage film between the semiconductor film and the first and second stacked bodies, wherein
a first dummy memory cell is at a position where a first conductive layer closest to the second stacked body among the first plurality of conductive layers meets the semiconductor film,
a first memory cell is at a position where a second conductive layer farther from the second stacked body than the first conductive layer among the first plurality of conductive layers meets the semiconductor film, and
a missing amount of an upper corner at an end portion of the first conductive layer facing the charge storage film is larger than a missing amount of an upper corner at an end portion of the second conductive layer facing the charge storage film.

2. The semiconductor device according to claim 1, wherein the first conductive layer satisfies the expression:

$$\Delta x < \Delta z (1 - \Delta z / W_{WL})$$

when $\Delta x$ is a missing amount in a planar direction perpendicular to the stacking direction at the upper corner of the first conductive layer, $\Delta z$ is a missing amount in the stacking direction at the upper corner of the first conductive layer, and $W_{ww}$ is a thickness in the stacking direction of the first conductive layer.

3. The semiconductor device according to claim 2, further comprising:
a first insulating film between the charge storage film and the first and second stacked bodies, the first insulating film having a side surface in contact with the charge storage film, wherein
the first conductive layer satisfies the expression:

$$\Delta x > (\sqrt{(1.25)} - 1) t_{BLK1}$$

when $t_{BLK1}$ is a thickness of the first insulating film in the planar direction between an end portion of a lower surface of the first conductive layer and the charge storage film.

4. The semiconductor device according to claim 2, further comprising:
a first insulating film between the charge storage film and the first and second stacked bodies; and
a second insulating film between the first insulating film and the first conductive layer, wherein
the first conductive layer satisfies the expression:

$$\Delta x > (\sqrt{(1.25)} - 1)(t_{BLK1} + t_{BLK2} / 2.6)$$

when $t_{BLK1}$ is a thickness of the first insulating film in the planar direction between an end portion of a lower surface of the first conductive layer and the charge storage film and $t_{BLK2}$ is a thickness of the second insulating film in the planar direction.

5. The semiconductor device according to claim 4, wherein a dielectric constant of the second insulating film is higher than a dielectric constant of the first insulating film.

6. The semiconductor device according to claim 4, wherein an upper surface, a lower surface, and an end surface facing the charge storage film of the first conductive layer are covered with the second insulating film.

7. The semiconductor device according to claim 1, wherein a second dummy memory cell is at a position where a third conductive layer closest to the first stacked body among the second plurality of conductive layers meets the semiconductor film, a second memory cell is at a position where a fourth conductive layer farther from the first stacked body than the third conductive layer among the second plurality of conductive layers meets the semiconductor film, and a missing amount of a lower corner at an end portion of the third conductive layer facing the charge storage film is larger than a missing amount of a lower corner at an end portion of the fourth conductive layer facing the charge storage film.

8. The semiconductor device according to claim 7, wherein the third conductive layer satisfies the expression:

$$\Delta xa < \Delta za(1-\Delta za/W_{WL})$$

when $\Delta xa$ is a missing amount in a planar direction perpendicular to the stacking direction at the lower corner of the third conductive layer, $\Delta za$ is a missing amount in the stacking direction at the lower corner of the third conductive layer, and $W_{WL}$ is a thickness in the stacking direction of the third conductive layer.

9. The semiconductor device according to claim 8, further comprising:

a first insulating film between the charge storage film and the first and second stacked bodies, the first insulating film having a side surface in contact with the charge storage film, wherein the third conductive layer satisfies the expression:

$$\Delta xa > (\sqrt{(1.25)}-1)t_{BLK1}$$

when $t_{BLK1}$ is a thickness of the first insulating film in the planar direction between an end portion of an upper surface of the third conductive layer and the charge storage film.

10. The semiconductor device according to claim 8, further comprising:

a first insulating film between the charge storage film and the first and second stacked bodies; and a second insulating film between the first insulating film and the third conductive layer, wherein the third conductive layer satisfies the expression:

$$\Delta xa > (\sqrt{(1.25)}-1)(t_{BLK1}+t_{BLK2}/2.6)$$

when $t_{BLK1}$ is a thickness of the first insulating film in the planar direction between an end portion of an upper surface of the third conductive layer and the charge storage film and $t_{BLK2}$ is a thickness of the second insulating film in the planar direction.

11. The semiconductor device according to claim 7, wherein the second conductive layer is closest to the first conductive layer among the first plurality of conductive layers, and an interval between the first conductive layer and the third conductive layer in the stacking direction is larger than an interval between the first conductive layer and the second conductive layer in the stacking direction.

12. The semiconductor device according to claim 1, further comprising:

a first insulating film between the charge storage film and the first and second stacked bodies, the first insulating film having a substantially flat side surface on the charge storage film side.

13. The semiconductor device according to claim 12, further comprising:

a third insulating film locally disposed between the first insulating film and the first conductive layer, the third insulating film having a different composition than the first insulating film.

14. The semiconductor device according to claim 13, wherein a dielectric constant of the third insulating film is lower than a dielectric constant of the first insulating film.

15. A semiconductor device, comprising:

a first stacked body in which a first plurality of conductive layers are stacked one on the other via an insulating layer;

a second stacked body above the first stacked body in a stacking direction, the second stacked body having a second plurality of conductive layers stacked one on the other via an insulating layer;

a semiconductor film passing through the first stacked body and the second stacked body in the stacking direction; and a charge storage film between the semiconductor film and the first and second stacked bodies, wherein a dummy memory cell is at a position where a first conductive layer closest to the first stacked body among the second plurality of conductive layers meets the semiconductor film, a memory cell is at a position where a second conductive layer farther from the first stacked body than the first conductive layer among the second plurality of conductive layers meets the semiconductor film, and a missing amount of a lower corner at an end portion of the first conductive layer facing the charge storage film is larger than a missing amount of a lower corner at an end portion of the second conductive layer facing the charge storage film.

16. The semiconductor device according to claim 15, wherein the first conductive layer satisfies the expression:

$$\Delta xa < \Delta za(1-\Delta za/W_{WL})$$

when $\Delta xa$ is a missing amount in a planar direction perpendicular to the stacking direction at the lower corner of the first conductive layer, $\Delta za$ is a missing amount in the stacking direction at the lower corner of the first conductive layer, and $W_{WL}$ is a thickness in the stacking direction of the first conductive layer.

17. The semiconductor device according to claim 16, further comprising:

a first insulating film between the charge storage film and the first and second stacked bodies, the first insulating film having a side surface in contact with the charge storage film, wherein the first conductive layer satisfies the expression:

$$\Delta xa > (\sqrt{(1.25)}-1)t_{BLK1}$$

when $t_{BLK1}$ is a thickness of the first insulating film in the planar direction between an end portion of an upper surface of the first conductive layer and the charge storage film.

18. The semiconductor device according to claim 16, further comprising:

a first insulating film between the charge storage film and the first and second stacked bodies; and a second insulating film between the first insulating film and the first conductive layer, wherein the first conductive layer satisfies the expression:

$$\Delta xa > (\sqrt{(1.25)} - 1)(t_{BLK1} + t_{BLK2}/2.6)$$

when $t_{BLK1}$ is a thickness of the first insulating film in the planar direction between an end portion of an upper surface of the first conductive layer and the charge storage film and $t_{BLK2}$ is a thickness of the second insulating film in the planar direction.

19. The semiconductor device according to claim 15, further comprising:

a first insulating film between the charge storage film and the first and second stacked bodies, the first insulating film having a substantially flat side surface on the charge storage film side.

20. The semiconductor device according to claim 19, further comprising:

a second insulating film between the first insulating film and the first conductive layer, the second insulating film having a different composition than the first insulating film; and a third insulating film locally disposed between the first insulating film and the second insulating film, the third insulating having a different composition than the first and second insulating films.

\* \* \* \* \*